United States Patent
Yang et al.

(10) Patent No.: US 7,955,889 B1
(45) Date of Patent: Jun. 7, 2011

(54) ORGANIC PHOTOSENSITIVE CELLS GROWN ON ROUGH ELECTRODE WITH NANO-SCALE MORPHOLOGY CONTROL

(75) Inventors: Fan Yang, Piscataway, NJ (US); Stephen R. Forrest, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 1186 days.

(21) Appl. No.: 11/483,642

(22) Filed: Jul. 11, 2006

(51) Int. Cl.
*H01L 51/44* (2006.01)
*H01L 51/48* (2006.01)

(52) U.S. Cl. ....... 438/82; 438/99; 257/40; 257/E51.014; 136/263

(58) Field of Classification Search .................. 136/252, 136/256, 263; 257/40, 431, E51.012–E51.017, 257/E31.124, E31.13; 438/57, 82, 99
See application file for complete search history.

(56) References Cited

U.S. PATENT DOCUMENTS

| | | | |
|---|---|---|---|
| 5,482,570 A * | 1/1996 | Saurer et al. .................. | 136/255 |
| 5,986,206 A | 11/1999 | Kambe et al. | |
| 6,291,763 B1 * | 9/2001 | Nakamura .................... | 136/256 |
| 6,593,522 B2 | 7/2003 | Nakano et al. | |
| 2001/0032665 A1 * | 10/2001 | Han et al. ....................... | 136/256 |
| 2004/0048000 A1 | 3/2004 | Shtein et al. | |
| 2004/0155236 A1 | 8/2004 | Fujisawa et al. | |
| 2004/0175500 A1 | 9/2004 | Fujisawa et al. | |
| 2005/0000564 A1 * | 1/2005 | Sato et al. ..................... | 136/256 |
| 2005/0061364 A1 * | 3/2005 | Peumans et al. ............. | 136/263 |
| 2005/0136232 A1 * | 6/2005 | Forrest et al. ................ | 428/212 |
| 2005/0227390 A1 | 10/2005 | Shtein et al. | |
| 2005/0276987 A1 | 12/2005 | Fujisawa et al. | |
| 2006/0016474 A1 | 1/2006 | Shiratsuchi et al. | |
| 2008/0012005 A1 * | 1/2008 | Yang et al. .................... | 257/40 |

FOREIGN PATENT DOCUMENTS

JP 2001-53307 2/2001

OTHER PUBLICATIONS

Aguilar, J. et al. SnO2, SnO2/Ag and Ag/SnO2 Thin Films Used as Propane Sensors. 2nd International Conference on Electrical and Electronics Engineering, 2005, Sep. 7-9, 2005, pp. 250-253.
Barretino, D. et al. Hotplate-Based Conductrometric Monolithic CMOS Gas Sensor System. 2003 Symposium, on VLSI Circuits, 2003, Digest of Technical Papers, Jun. 12-14, 2003, pp. 157-160.

(Continued)

*Primary Examiner* — Matthew W Such
(74) *Attorney, Agent, or Firm* — Finnegan, Henderson, Farabow, Garrett & Dunner, L.L.P.

(57) ABSTRACT

An optoelectronic device and a method for fabricating the optoelectronic device includes a first electrode disposed on a substrate, an exposed surface of the first electrode having a root mean square roughness of at least 30 nm and a height variation of at least 200 nm, the first electrode being transparent. A conformal layer of a first organic semiconductor material is deposited onto the first electrode by organic vapor phase deposition, the first organic semiconductor material being a small molecule material. A layer of a second organic semiconductor material is deposited over the conformal layer. At least some of the layer of the second organic semiconductor material directly contacts the conformal layer. A second electrode is deposited over the layer of the second organic semiconductor material. The first organic semiconductor material is of a donor-type or an acceptor-type relative to the second organic semiconductor material, which is of the other material type.

34 Claims, 14 Drawing Sheets

OTHER PUBLICATIONS

Barrettino, D. et al. Hotplate-Based Monolithic CMOS Microsystems for Gas Detection and Material Characterization for Operating Temperatures Up to 500/spi deg/C. IEEE Journal of Solid-State Circuits, vol. 39, Issue 7, Jul. 2004, pp. 1202-1207.

Bose, J.-M. et al. Accelerated Life Testing for Micro-Machined Chemical Sensors. IEEE Transactions on Reliability, vol. 47, Issue 2, Jun. 1998, pp. 135-141.

Chowdhuri, A. et al. Enhanced Catalytic Activity of Ultrathin CuO Islands on SNo/sub2/ films for Fast Response H/sub 2/S Gas Sensors. Sensors Journal, IEEE, vol. 3, Issue 6, Dec. 2003, pp. 680-686.

Chung-We Pan et al. Using Polypyrrole as the Contrast pH Detector to Fabricate a Whole Solid-State Ph Sensing Device. Sensors Journal, IEEE, vol. 3, Issue 2Apr. 2003, pp. 164-170.

Cobianu, C. et al. Tin Dioxide Sol-Gel Derived Thin Films Deposited on Porous Sililcon; Semiconductor Conference, 1996., International, vol. 2, Oct. 9-12, 1996, pp. 633-636, vol. 2.

Eastwood, P.G. et al. Development of Tin Dioxide Based Exhaust Sensors. Eighth International Conference on Automotive Electronics, 1991., Oct. 28-31, 1991, pp. 19-23.

Egashira, M. et al. Hydrogen-Sensitive Breakdown Voltage in the I-V Characteristics of Tin Dioxide-based Semiconductors. The 8th International Conference on Solid-State Sensors and Actuators, 1995 and Eurosensors IX. Transducers '95, vol. 1, Jun. 25-29, 1995, pp. 718-721.

Forrest, S. Ultrathin Organic Films Grown by Organic Molecular Beam Deposition and Related Techniques. Chem. Rev. 1997, 1997 American Chemical Society, pp. 1793-1896.

Graf, M. et al. Monolithic Metal-Oxide Microsensor System in Industrial CMOS Technology. The Sixteenth Annual International Conference on Micro Electro Mechanical Systems, 2003, MEMS-03 Kyoto. IEEE. Jan. 19-23, 2003; pp. 303-306.

Ionescu, R. et al. Measurements in Transient Regimes After Steep Humidity Changes: A Method for Investigating the Reaction Sites in $SNo_2$ Gas Sensors. Semiconductor Conference, 1999. CAS '99 Proceedings. 1999 International, vol. 2, Oct. 5-9, 1999, pp. 447-450 vol. 2.

Klonowski, T. et al. High Intensity Contact Opening Under DC Voltage; Electrical Contacts, 2004. Proceedings of the 50th IEEE Holm Conference on Electrical Contacts and the 22nd International Conference on Electrical Contacts, 2004 pp. 459-466.

Kololuoma, T. et al. Effects of Argon Plasma Treatment on Conductivity of Sol-Gel Fabricated Sb-doped $SnO_2$ thin films. Electronic Letters, vol. 36, Issue 2, Jan. 20, 2000, pp. 172-173.

Lozano, J. et al. Identification of Typical Aromas of Red Wines with Thin Film Sensors Combined with Pattern Recognition Techniques. 2005 Spanish Conference on Electron Devices, Feb. 2-4, 2005, pp. 549-552.

Minghong Wu et al. The Effects of Electronic Beam Radiation on Tin Dioxide Gas Sensors. The 13th International Conference on Solid-State Sensors, Acctuators and Microstystems, 2005. Digest of Technical Papers, Transducers '05, vol. 2, Jun. 5-9, 2005, pp. 1896-1898 vol. 2.

Mizsei, J. Vibrating Capacitor: Applications in the Research of Semiconductor Gas Sensors. Sensors, 2004. Proceedings of IEEE, Oct. 24-27, 2004, pp. 947-950, vol. 2.

Mizsei, J. et al. In Situ STM and AFM Characterization of Pd Nanoparticle Activated SnO/sub2/ Sensor Surface. Sensors, 2005. Proceedings of IEEE, Oct. 24-27, 2004, pp. 673-676, vol. 2.

Nguyen Hoa Hong et al. Ferromagnetic Transition-Metal-Doped Tin Dioxide Thin Films. Magnetics Conference, 2005. INTERMAG Asia 2005. Digests of the IEEE International, Apr. 4-8, 2005, pp. 775-776.

Ovenden, N. A. et al. The Use of Combustion Sensors in Domestic Gas Appliances. IEE Colloquium on Modern Development in Electronic Control Systems in the Gas Industry, Jan. 25, 1993, pp. 1/1-1/3.

Pulvari, C.F. et al. A New Graded Electrode for Forming Intimate Contact with Ferroelectrics. IEEE Transactions on Electron Devices, vol. 16, Issue 6, Jun. 1969, pp. 532-535.

Raible, S. et al. Wafer Level Packaging of Micro-Machined Gas Sensors. Sensors, 2004. Proceedings of IEEE, Oct. 24-27, 2004, pp. 746-748, vol. 2.

Sabnis, A. et al. Heat Treatment of Dc-Sputtered Tin Dioxide Thin Films. IEEE Transactions on Parts, Hybrids, and Packaging, vol. 12, Issue 4, Dec. 1976, pp. 357-360.

Sang-Mun Lee et al. A Field Effect Transistor Type Gas Sensor Based on Polyaniline. The 13th International Conference on Solid-State Sensors, Actuators and Microsystems, 2005. Digest of Technical Papers. Transducers '05, vol. 2, Jun. 5-9, 2005, pp. 1935-1938, vol. 2.

Sarry, F. et al. Gas Discrimination in Air-Conditioned System. IEEE Transactions on Instrumentation and Measurement, vol. 49, Issue 4, Aug. 2000, pp. 809-812.

Schneider, T. et al. Platinum-Doped Nanogranular-Tin Dioxide Layers Prepared by Spin-Coating from Colloidal Dispersions as Basis for Gradient Gas Sensor Micro Arrays. Sensors, 2004. Proceedings of IEEE, Oct. 24-27, 2004, pp. 196-197, vol. 1.

Vrnata, M. et al. Pulsed Laser Deposition of Thin Layers from Tin Acetyl-Acetone and Tin Oxide Targets. The Pacific Rim Conference on Lasers and Electro-Optics, 1999. CLEO/Pacific Rim '99, vol. 2, Aug. 30-Sep. 3, 1999, pp. 362-363, vol. 2.

Vrnata, M. et al. The Characterization of Laser-Deposited Thin Sensitive Layers of Gas Sensors. The Third International EuroConference on Advanced Semiconductor Devices and Microsystems, 2000 ASDAM 2000, Oct. 16-18, 2000, pp. 205-208.

Vrnata, M. et al. Compound Tin Dioxide-Tin Acetylacetonate Based Sensors Prepared by Pulsed Laser Deposition. Sensors, 2004. Proceedings of IEEE, Oct. 24-27, 2004, pp. 708-711, vol. 2.

Vyslouzil, F. et al. Impedance Measurements of Chemical Gas Sensors. The Fourth International Conference on Advanced Semiconductor Devices and Microsystems, 2002, Oct. 14-16, 2002, pp. 317-320.

Wong, K.K.L.; Zhenan Tang; Sin, J.K.O.; Chan, P.C.H.; Cheung, P.W.; Hiraoka, H.; Study on Selectivity Enhancement of Tin Dioxide Gas Sensor Using Non-Conducting Polymer Membrane. Electron Devices Meeting, 1995. Proceedings., 1995 IEEE Hong Kong, Jul. 1, 1995, pp. 42-45.

Wong, K.K.L. et al. Selectivity Enhancement of Tin Dioxide Gas Sensor with Polymer Membrane. Tencon '95 1995 IEEE Region 10 International Conference on Microelectronics and VLSI, Nov. 6-10, 1995, pp. 179-182.

Wong, K.K.L. et al. Sensing Mechanism of Polymer for Selectivity of Enhancement of Gas Sensors. 1996 IEEE International Conference on Semiconductor Electronics, 1996, ICSE '96, Proceedings., Nov. 26-28, 1996, pp. 217-220.

Zhilun Gui et al. Investigation on Piezoelectric Ceramics with High $d_{33}$ $d_{31}$ for a new type of rotational stepper motor. Proceedings of the Ninth IEEE International Symposium on Applications of Ferroelectrics, 1994, ISAF '94., Aug. 7-10, 1994, pp. 387-389.

Baldo M. et al. 1999. Organic Vapor Phase Deposition. Advanced Materials. vol. 10, No. 18, pp. 1505-1514.

Forrest S.R. 2004. The path to ubiquitous and low-cost organic electronic appliances on plastic. Nature, vol. 428, No. 29 (Apr. 2004), pp. 911-918.

Jansseune T. 2005. Indium Price Soars as Demand for Displays Continues to Grow. Compound Semiconductor, pp. 34-35. May 2005.

Kololuoma T. et al. 2000. Effect of argon plasma treatment on conductivity of sol-gel fabricated Sb-doped-$SnO_2$ thin films. Electronics Letters, vol. 36, No. 2 (Jan. 20, 2000), pp. 172-173.

Miyata T. et al. 2004. Highly transparent and conductive ZnO: Al thin films prepared by vacuum arc plasma evaporation. J. Vac. Sci. Technol., vol. A22, No. 4 (Jul./Aug. 2004), pp. 1711-1715.

Shtein M. et al. 2002. Effects of film morphology and gate dielectric surface preparation on the electrical characteristics of organic vapor phase deposited pentacene thin-film transistors. Applied Physics Letters. vol. 81, No. 2 (Jul. 8, 2002), pp. 268-270.

Steinhauser J. et al. 2005. Effect of Rough ZnO Layers in Improving Performances of Microcrystalline Silicon Solar Cell. In Proceedings of the 20th EU Photovoltaic Solar Energy Conference, ISBN 3-936338-19-1, WIP Renewable Energies, pp. 1608-1611.

Van Mol T. 2003. Transparent Conducting Oxides. PVNET Workshop Feb. 14, 2003. 19-page slide presentation. downloaded from http://web.archive.org/web/20040903111701/http://paris.fe.uni-lj.si/pvnet/workshop2003/files/20_Mol.pdf.

Von Rottkay K. et al. 1996. Optical Indices of Pyrolytic Tin-Oxide Glass. Mater. Res. Soc. Symp. Proc., vol. 426, p. 449 (7 pages).

Vorburger T. et al. 2002. In the Rough. SPIE's OE Magazine, Mar. 2002, pp. 31-34.

White M. 2005. Production and Analysis of Conjugate Polymer/ZnO Solar Cells. NNIN REU Research Accomplishments 2005, pp. 156-157.

Yang F. et al. 2004. Controlled growth of a molecular bulk heterojunction photovoltaic cell. Nature Materials, vol. 4 Jan. 2005, pp. 37-41(published online in www.nature.com/naturematerials, Dec. 12, 2004).

Yang, F. et al. 2006. Organic Solar Cells Using Transparent $SnO_2$-F Anodes. Advanced Materials, vol. 18, No. 15 (2006), pp. 2018-2022.

M.G. Donoso et al., "On the relationship between common amplitude surface roughness parameters and surface area: Implications for the study of cell-material interactions," Int. Biodeterioration & Biodegradation (2007) 59: 245-251.

* cited by examiner

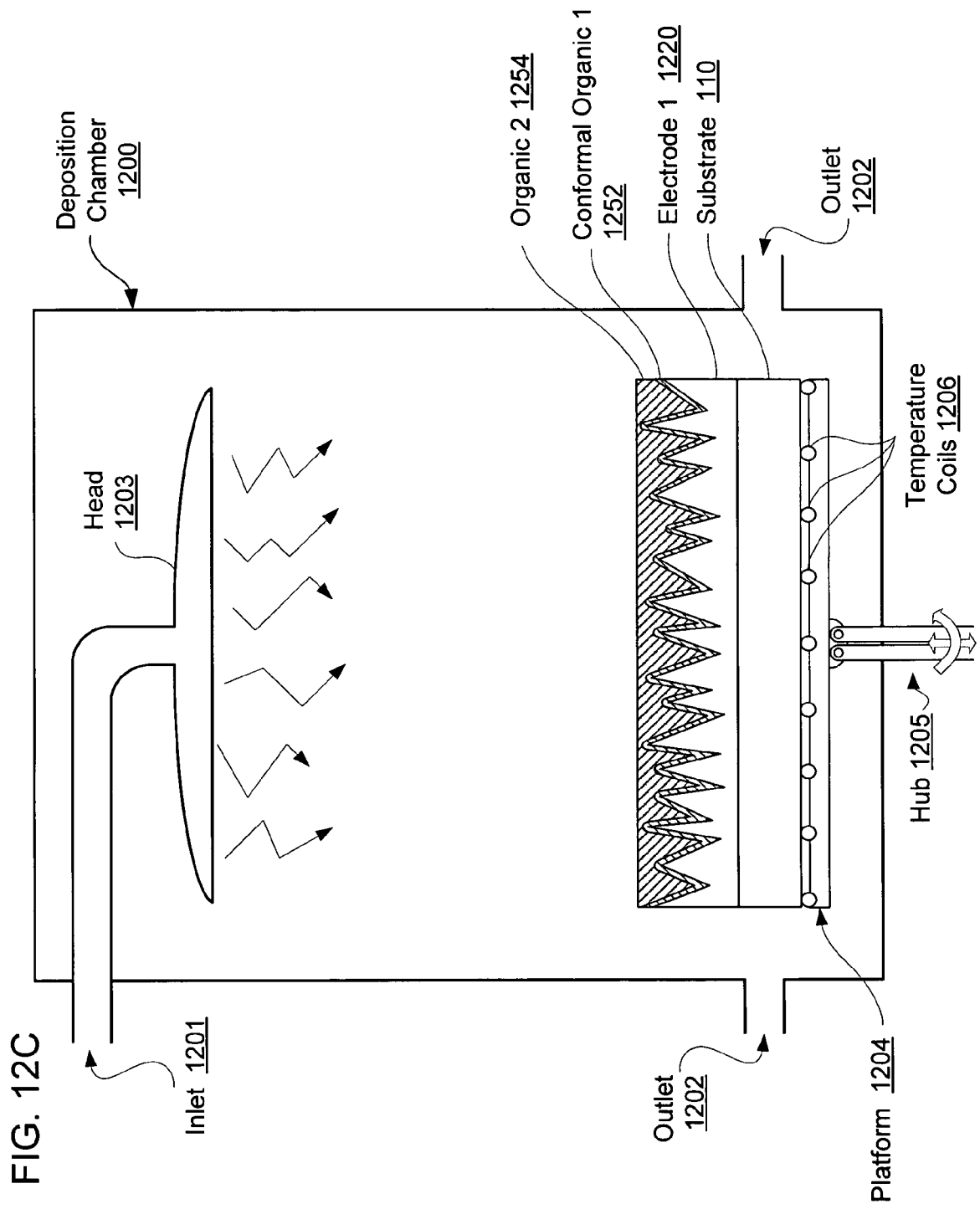

ORGANIC PHOTOSENSITIVE CELLS GROWN ON ROUGH ELECTRODE WITH NANO-SCALE MORPHOLOGY CONTROL

UNITED STATES GOVERNMENT RIGHTS

This invention was made with government support under Contract No. XAT-5-33636-03 awarded by U.S. Department of Energy, National Renewable Energy Laboratory. The government has certain rights in the invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having a rough electrode.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to ultraviolet-ozone or a plasma).

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

A figure of merit for photovoltaic devices is the fill factor, ff, defined as:

$$ff=\{I_{max}V_{max}\}/\{I_{SC}V_{OC}\}$$

where ff is always less than 1, as the short-circuit current $I_{SC}$ and the open circuit voltage $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P=ff*(I_{SC}*V_{OC})/P_{inc}$$

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

An embodiment of the invention is a method of fabricating an optoelectronic device. The method includes providing a first electrode disposed on a substrate, an exposed surface of the first electrode having a root mean square roughness of at least 30 nm and a height variation of at least 200 nm, the first electrode being transparent; depositing a conformal layer of a first organic semiconductor material onto the first electrode by organic vapor phase deposition, the first organic semiconductor material being a small molecule material; depositing a layer of a second organic semiconductor material over the conformal layer, at least some of the layer of the second organic semiconductor material directly contacting the conformal layer; and depositing a second electrode over the layer of the second organic semiconductor material, wherein the first organic semiconductor material is of a donor-type or an acceptor-type relative to the second organic semiconductor material, which is of the other material type. The conformal layer is preferably deposited by organic vapor phase deposition, although other methods can be used.

The first electrode preferably consists essentially of doped or undoped transparent conducting oxide or carbon nanotubes in a small molecule or polymer matrix. The first electrode preferably has a surface area at least 1.2 times greater than a surface area of the underlying substrate. The conformal layer preferably has a thickness of less than 300 Å, or more preferably, less than 200 Å. The second organic material is preferably a continuous layer.

The height variation of the first electrode is preferably at least three times larger, or more preferably five times larger, than a thickness of the conformal layer plus a minimum thickness of the layer of the second organic semiconductor material.

The conformal layer of the first organic semiconductor material may be deposited directly onto the first electrode. A strain can be created in the conformal layer at an interface with the first electrode. Depositing the conformal layer may include depositing the first organic semiconductor material onto said first electrode until a lattice structure of the first organic semiconductor material relaxes, forming a plurality of domains of the first organic semiconductor material, the conformal layer being polycrystalline.

The first organic semiconductor material may be a donor-type material relative to the second organic semiconductor material, which is an acceptor-type material. Preferred donor-type materials include a phthalocyanine, a phthalocyanine derivative, and 3,4,9,10-perylene tetracarboxylic dianhydride (PTCDA). Examples of a phthalocyanine include copper phthalocyanine (CuPc), tin phthalocyanine (SnPc) and zinc phthalocyanine (ZnPc). Examples of a phthalocyanine derivative include chloro[subphalocyaninato]boron(III) (SubPc).

The first organic semiconductor material may be an acceptor-type material relative to the second organic semiconductor materials, which would be a donor-type material. Preferred acceptor-type materials include polyhedral fullerenes having at least 60 carbon atoms and 3,4,9,10-perylenetetracarboxylic bis-benzimidazole (PTCBI).

The method may further include depositing nanometer scale protrusions of the first organic semiconductor material directly onto the conformal layer, the combination of the conformal layer with the protrusions having a surface area at least two times greater than a surface area of the conformal layer without the protrusions, wherein the layer of the second organic semiconductor material is deposited after the depositing of the protrusions. The height of each protrusion is preferably greater than a cross-sectional width of the respective protrusion.

From any point within the first organic semiconductor material deposited as the conformal layer and the protrusions, a distance to an interface boundary with a layer of an opposite material type is preferably no more than 2.5 exciton diffusion lengths of the first organic semiconductor material.

Another embodiment of the invention is a device that includes a substrate having a first electrode thereon, a surface of the first electrode opposite the substrate having a root mean square roughness of at least 30 nm and a height variation of at least 200 nm. At least one donor-acceptor heterojunction composed of a conformal layer of a first organic semiconductor material is on the surface of the first electrode and a layer of a second organic semiconductor material on the conformal layer. The first organic semiconductor material is a small molecule material. At least some of the second organic semiconductor material directly contacts the conformal layer. The first organic semiconductor material is of a donor-type or an acceptor-type relative to the second organic semiconductor material, which is of the other material type. A second electrode is on the donor-acceptor heterojunction.

The first electrode preferably consists essentially of a material selected from a doped or undoped transparent conducting oxide, and carbon nanotubes in a small molecule or polymer matrix. The first electrode preferably has a surface area at least 1.2 times greater than a surface area of the underlying substrate. The conformal layer preferably has a thickness of less than 300 Å, and more preferably, less than 200 Å.

The layer of the second organic material is preferably a continuous layer. The height variation of the first electrode is preferably at least three times larger, and more preferably at least five times larger, than the thickness of the conformal layer plus a minimum thickness of the layer of the second organic semiconductor material.

The conformal layer is preferably polycrystalline.

The donor-type material is preferably a phthalocyanine, a phthalocyanine derivative, or 3,4,9,10-perylene tetracarboxylic dianhydride (PTCDA). Examples of a phthalocyanine include copper phthalocyanine (CuPc), tin phthalocyanine (SnPc) and zinc phthalocyanine (ZnPc). Examples of a phthalocyanine derivative include chloro[subphalocyaninato]boron(III) (SubPc).

The acceptor-type material is preferably a polyhedral fullerene having at least 60 carbon atoms or 3,4,9,10-perylenetetracarboxylic bis-benzimidazole (PTCBI).

The device may further include at least one donor-acceptor heterojunction having nanometer scale protrusions of the first organic semiconductor material, in direct contact with the conformal layer and being between the conformal layer of the first organic semiconductor material and the layer of the second organic semiconductor material. The combination of the conformal layer with the protrusions has a surface area at least two times greater than a surface area of the conformal layer without the protrusions. The height of each protrusion is preferably greater than a cross-sectional width of the respective protrusion. Preferably, from any point within the conformal layer and the protrusions, a distance to an interface boundary with a layer of an opposite material type is no more than 2.5 exciton diffusion lengths of the first organic semiconductor material.

BRIEF DESCRIPTION OF THE DRAWINGS

FIG. 12C illustrates a second organic semiconductor material being deposited on the conformal layer to form a donor-acceptor heterojunction.

FIG. 26 illustrates responsivity, defined as J$_{SC}$/P$_0$, where P$_0$ is the incident light intensity and J$_{SC}$ is the short circuit current. FIG. 27 illustrates fill factor (ff). FIG. 28 illustrates open circuit voltage (V$_{OC}$). FIG. 29 illustrates power conversion efficiency ($\eta_P$).

The figures are not necessarily drawn to scale. Various proportions are exaggerated.

DETAILED DESCRIPTION

Figure 1:
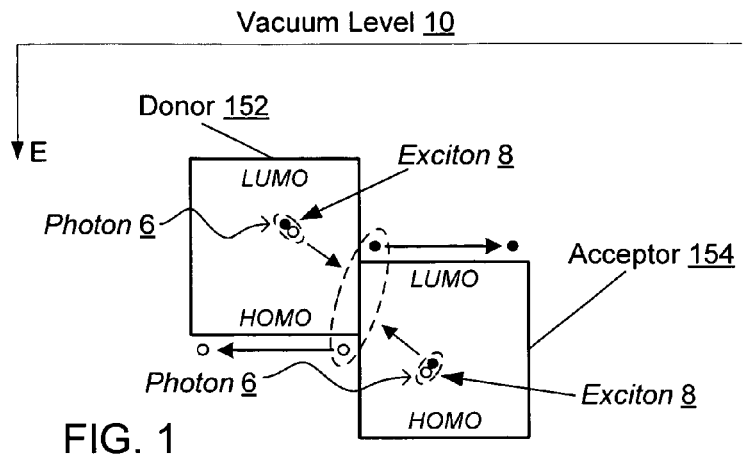
FIG. 1 is an energy level diagram illustrating a donor-acceptor heterojunction.
Figure 2:
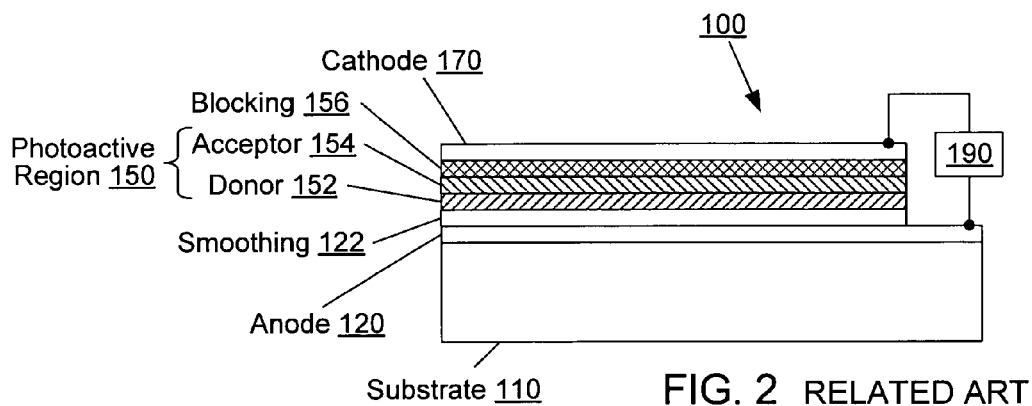
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
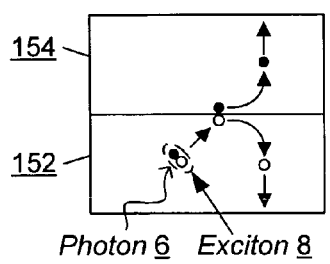
FIG. 3 illustrates a donor-acceptor bilayer forming a planar heterojunction.
Figure 4:
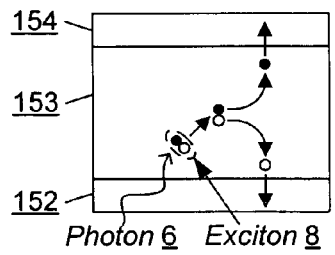
FIG. 4 illustrates a hybrid heterojunction including a mixed heterojunction between a donor layer and an acceptor layer.
Figure 5:
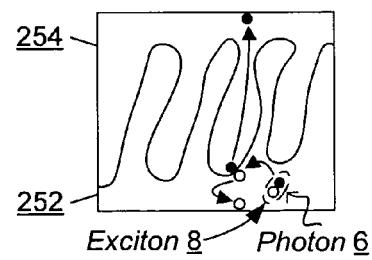
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
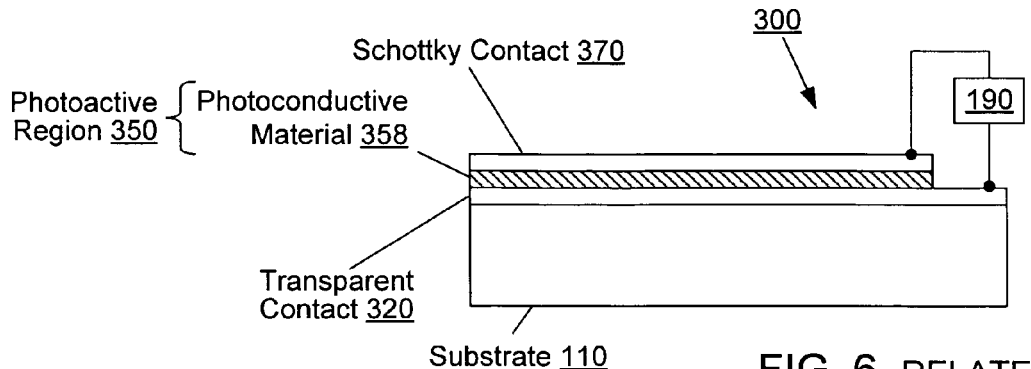
FIG. 6 illustrates an organic photosensitive device including a Schottky-barrier heterojunction.

FIG. 6 shows an example of an organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
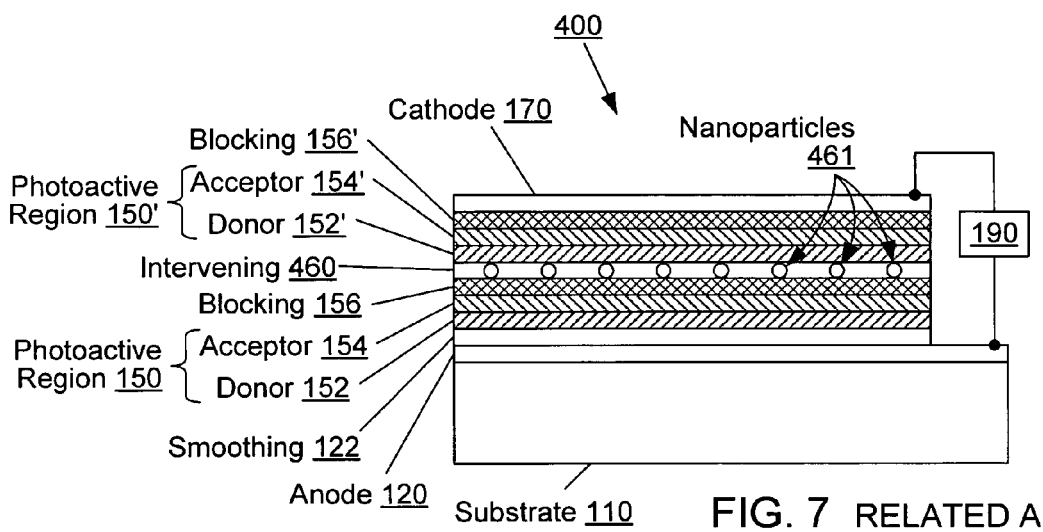
FIG. 7 illustrates tandem photosensitive cells in series.
Figure 8:
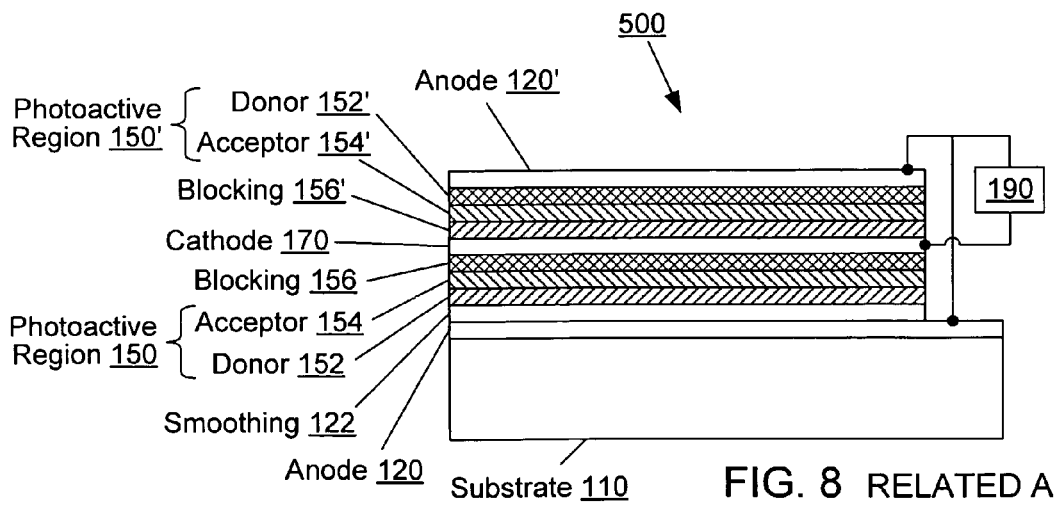
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the smoothing layer and the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., published Dec. 1, 2005, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Organic solar cells have attracted attention as a means to achieve low-cost solar-energy conversion owing to their ease of manufacture and compatibility with flexible substrates. Conventional organic molecular photosensitive devices and light-emitting diodes (OLEDs) are typically grown on transparent indium-tin-oxide (ITO) anodes that are also widely used for flat panel displays. The scarcity of indium, along with the rapid expansion of flat panel display production, has resulted in a soaring price of ITO-coated glass substrates. The current price for indium is up to ten times greater than the price in 2003. See, for example T. Jansseune, "Indium Price Soars As Demand For Displays Continues to Grow," *Compound Semiconductor* 11, 34 (2005).

Alternative, less expensive transparent conducting oxides such as doped $SnO_2$ or ZnO, have been used as electrodes in dye-sensitized, CdTe, microcrystalline Si, and a-Si photovoltaic devices. See, for example, M. Grätzel, *MRS Bulletin* 30, 23 (2005); T. L. Chu, S. S. Chu, C. Ferekides, J. Britt, C. Q. Wu, *Journal of Applied Physics* 69, 7651 (1991); and Y. Arai, M. Ishii, H. Shinohara, S. Yamazaki, *IEEE Electron Device Letters* 12, 460 (1991). However, while organic small molecule devices and polymeric devices typically utilize active layers of less than 1000 Å thick with smooth anodes, use of similar thickness with anodes such as $SnO_2$ and ZnO results in the formation of short circuits during production due to the pronounced surface roughness characteristic of these oxide variants.

Figure 9:
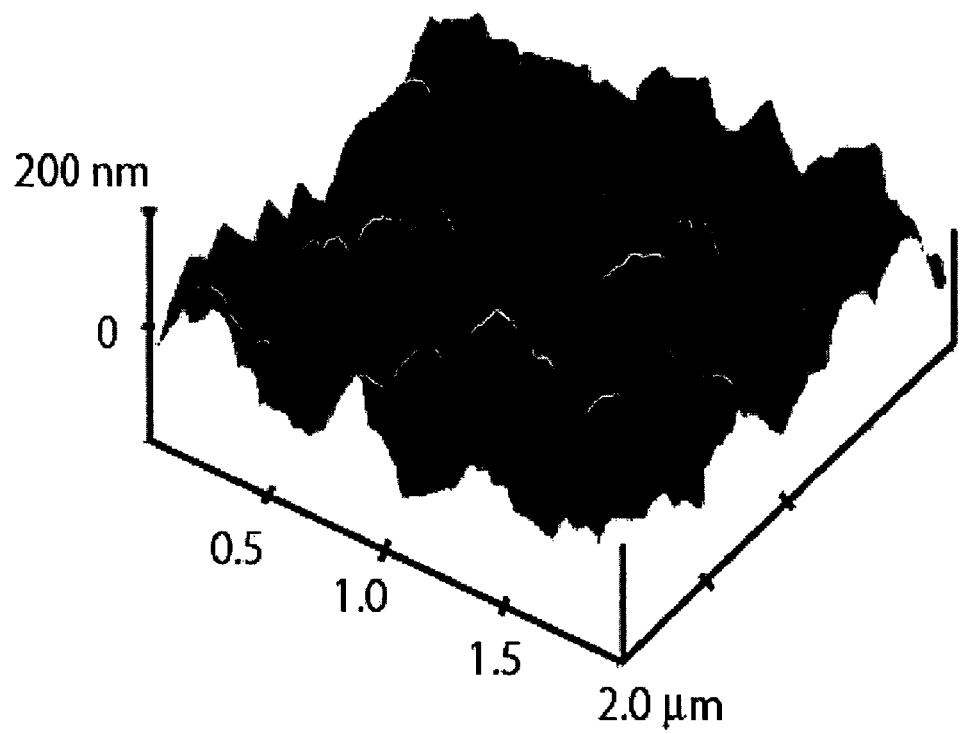
FIG. 9 illustrates the topography of $SnO_2$:F-coated glass measured by atomic force microscope. The RMS surface roughness is 38.7±0.8 nm for $SnO_2$:F. The distance between highest and lowest point (z-range) in the scan is 290 nm for $SnO_2$:F.
Figure 10:
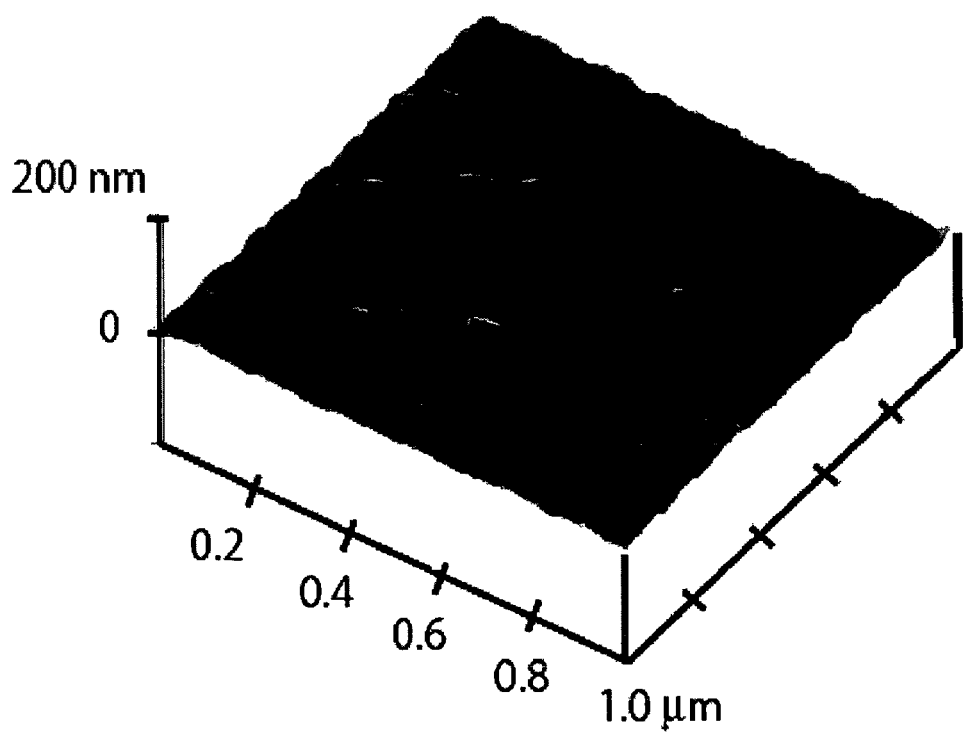
FIG. 10 illustrates the topography of ITO-coated glass substrates measured by atomic force microscope. The RMS surface roughness is 2.8±0.6 nm for ITO. The distance between highest and lowest point (z-range) in the scan is 27 nm for ITO.

Comparisons of surface roughness between flourine-doped $SnO_2$ ($SnO_2$:F) and ITO-coated glass substrates are shown in FIGS. 9 and 10, respectively. Cross-sectional scanning electron microscope (SEM) images (not shown) reveal that $SnO_2$:F forms large crystals with an average layer thickness of approximately 750 nm, resulting in a surface root mean square (RMS) roughness of (38.7±0.8) nm, and a total height variation in a $(2 \mu m)^2$ area as large as 290 nm (see the atomic force microscope image in FIG. 9). By comparison, the ITO layer is only 150 nm thick, whose comparatively smooth surface (FIG. 10) has an RMS roughness of (2.8±0.6) nm and a height variation of 27 nm. The difference in oxide thickness also contributes to the difference of transmittance of the two of substrates.

Solar cells with an organic double heterojunction structure of copper phthalocyanine donor (CuPc, 200 Å)/$C_{60}$ acceptor (400 Å)/2,9-dimethyl-4,7-diphenyl-1,10-phenanthroline exciton blocking layer (BCP, 100 Å) and a 1000 Å-thick Ag cathode grown on ITO-coated glass by conventional vacuum thermal evaporation (VTE) have been shown to have a power conversion efficiency of $\eta_P$=3.6±0.2% (see J. Xue, S. Uchida, B. P. Rand, S. Forrest, *Applied Physics Letters* 84, 3013 (2004)). In contrast, devices with the same organic layers deposited on the $SnO_2$:F-coated glass described above show an ohmic (i.e. non-rectifying) behavior.

The large crystal grains of doped $SnO_2$ and ZnO electrodes penetrate through the donor-acceptor heterojunction interface, creating a short circuit pathway for charge carriers to pass between the electrodes. When the pathways are large, the device does not work at all. When the pathways are small, the device may work, but with poor efficiency. In the ohmic device described above, The rough surface of the $SnO_2$:F induces direct contact between the oxide anode and either the $C_{60}$ acceptor or the Ag cathode, thus shorting the CuPc/$C_{60}$ junction.

While there have been reports of using rough transparent electrode materials such as $SnO_2$:F for the transparent anode of polymeric OLEDs and solar cells, to our knowledge there has yet to be a demonstration of an organic heterojunction photovoltaic cell based on such anodes with an efficiency greater than 0.1%. For OLED examples, see J. C. Bernede, F. Brovelli, S. Marsillac, F. R. Diaz, M. A. Del Valle, C. Beaudouin, *Journal of Applied Polymer Science* 86, 1128 (2002); A. R. V. Benvenho, J. P. M. Serbena, R. Lessmann, I. A. Hümmelgen, R. M. Q. de Mello, R. W. C. Li, J. H. Cuvero, J. Gruber, *Brazilian Journal of Physics* 35, 1016 (2005). For solar cell examples, see R. Valaski, R. Lessmann, L. S. Roman, I. A. Hümmelgen, R. M. Q. Mello, L. Micaroni, *Electrochemistry Communications* 6, 357 (2004); R. Valaski, F. Muchenski, R. M. Q. Mello, L. Micaroni, L. S. Roman, I. A. Hümmelgen, *Journal of Solid State Electrochemistry* 10, 24 (2006).

Nevertheless, the cost, optical characteristics, and conductivities of rough transparent electrode materials make them very attractive as an electrode material. The cost of $SnO_2$:F-coated glass is less than one-third that of ITO-coated glass. Any number of less-expensive transparent electrically conducting oxides (TCOs) with high surface roughness are available. Examples of other less-expensive rough transparent conducting oxides include ZnO and $SnO_2$. Preferably, the conductivity of the rough TCO is increased by doping, such as with aluminum-doped ZnO (ZnO:Al), antimony-doped $SnO_2$ ($SnO_2$:Sb), fluorine-doped ZnO (ZnO:F), and gallium-doped ZnO (ZnO:Ga). In addition, as an alternative to TCOs, a transparent rough transparent oxide with exceptional conductivity properties can be formed from carbon nanotubes in a small molecule or polymer matrix. If desired, more examples of more expensive rough TCOs that can be used include GaO and InGaO.

Figure 11:
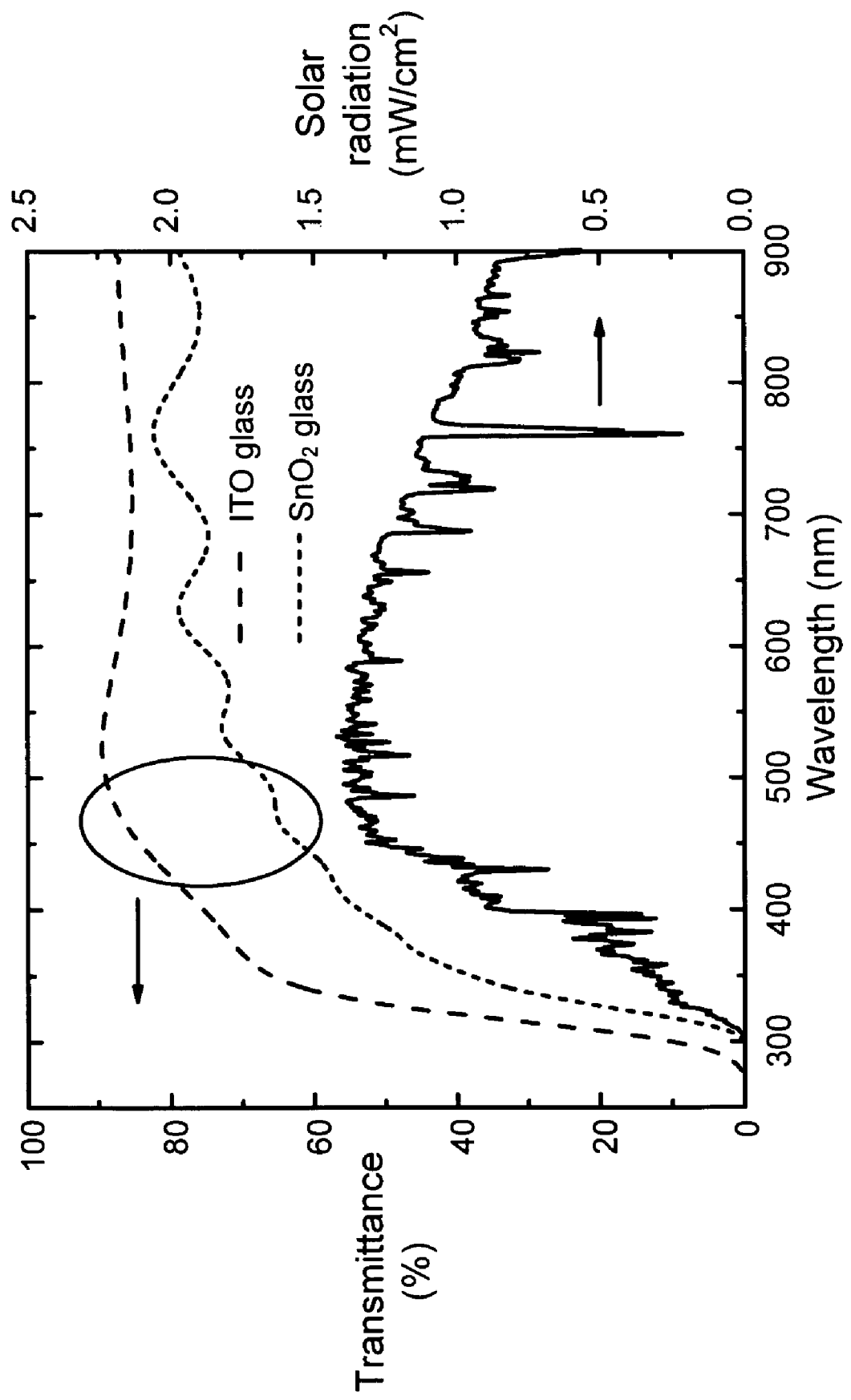
FIG. 11 illustrates transmittance of $SnO_2$:F and ITO-coated glass with respect to air mass (AM) 1.5 solar radiation spectra.

As shown in FIG. 11, a 750 nm thick $SnO_2$:F coated glass substrate has 70%-80% transmittance across the visible range, or approximately 10% less than that for 150 nm thick ITO coatings. The absorption of both substrates has a high energy cutoff at wavelengths λ<350 nm, implying a match of the transparency window to that of the solar radiation spectrum (i.e., an air mass 1.5 reference solar spectral irradiance as defined by *American Society for Testing and Materials* (*ASTM*) G-173-03). The sheet resistance of $SnO_2$:F coated glass is less than 12 Ω/sq. (available from *Asahi Glass Fabritech Co., Ltd.* 3-25-12, Tarumi-cho, Suita-city, Osaka, Japan, 564-0062), lower than the 15 Ω/sq. sheet resistance of ITO coated glass (as reported by J. Xue, S. Uchida, B. P. Rand, S. Forrest, *Applied Physics Letters* 84, 3013 (2004)).

The high transparency and small resistance of $SnO_2$:F coated glass make this material suitable for solar cell applications. High transparency in the visible range with low resistivities have also been reported for other rough electrode materials such as ZnO:Al, ZnO:F, and ZnO:Ga. See, for example, T. Miyata, Y. Minamino, S. Ida, and T. Minami, *Journal of Vacuum Science & Technology A: Vacuum, Surfaces, and Films* 22, 1711 (2004).

A widely used solution to prevent short circuits due to heterojunction penetration by a rough anode is to make the bottom layer of the donor-acceptor heterojunction sufficiently thick to assure coverage of the crystal grains. This solution results in an increase in series resistance within the device, reducing overall efficiency. Efficiency is reduced because a significant number of excitons never reach the heterojunction to disassociate before quenching.

Another solution to prevent short-circuits with rough electrode materials is to deposit a planarizing smoothing layer over the electrode before depositing the heterojunction materials. Such a planarizing layer can be added, for example, by spin-coating a 200 nm-thick 3,4-polyethylenedioxythiophene: polystyrenesulfonate (PEDOT:PSS) planarizing layer (see P. Peumans, S. R. Forrest, *Applied Physics Letters* 79, 126 (2001)) on the $SnO_2$:F surface prior to VTE deposition of the CuPc (200 Å) donor/$C_{60}$ (400 Å) acceptor/BCP (100 Å) exciton blocker/Ag (1000 Å) cathode minimizes or eliminates roughness-induced shorts. However, it also introduces additional series resistance, thereby resulting in solar cells with power conversion efficiencies <0.1%.

Another approach that has been taken to eliminate short-circuits with rough electrode materials is to minimize the formation of the large crystal grains in the electrode material, resulting in a smoother electrode. See, for example, U.S. Patent Application Publication 2005-0276987 A1. While this approach may facilitate the use of less expensive electrode materials, it eliminates the surface roughness that ideally could be used to diffuse incident light, increase the interface area of the heterojunction, and increase light trapping in the photoactive region.

In general, it is desirable to increase the surface area of the donor-acceptor junction. While there have been efforts to increase the surface area of the donor-acceptor heterojunction by shaping the surface of the anode (see, U.S. Pat. No. 5,986, 206, employing large-scale anode corrugation), a device utilizing an organic semiconductor conformal layer able to replicate the underlying nano-scale surface features of a rough electrode has remained out of reach.

As disclosed herein, the short-circuit problems with rough electrodes can be eliminated while retaining the surface topography of the electrode by depositing a conformal layer of an organic semiconductor material on the electrode by delivery of a vapor of the organic semiconductor material in an inert carrier gas under conditions that promote surface diffusivity. The preferred delivery method is organic vapor phase deposition (OVPD), where the molecules have a short mean free path (<1 cm) in the gas phase. OVPD can be used to deposit materials that do not thermally decompose when the molecular source is heated, such as small molecule materials, monomers, oligomers, and dendrimers. For a background discussion for growth of organic layers by OVPD, see M. Baldo, M. Deutsch, P. Burrows, H. Gossenberger, M. Gerstenberg, V. Ban, S. Forrest, *Advanced Materials* 10, 1505 (1998).

OVPD are inherently different from the widely used vacuum thermal evaporation (VTE) in that a carrier gas is used to transport vapors into a deposition chamber. Spatially separating the functions of evaporation and transport leads to precise control over the deposition process. The source materials and deposition chamber walls are heated during OVPD, with separate control of the surface temperature of the target.

Unlike growth by VTE where the molecules follow radial trajectories from source to substrate, the molecules in OVPD have non-ballistic trajectories and diffuse through a hydrodynamic boundary layer before reaching the substrate at random incident angles. The flow of the carrier gas around the substrate creates the hydrodynamic boundary layer where molecular transport is diffusion-limited. The deposition rate, deposition efficiency, and film morphology are controlled by adjusting the organic species concentration, flow hydrodynamics, and surface diffusivity. The molecules can diffuse into recesses on rough surfaces that are otherwise unreachable by VTE (see F. Yang, M. Shtein, S. R. Forrest, *Nature Materials* 4, 37 (2005)).

Using OVPD, a thin conformal layer can be grown on an electrode having a root mean square (rms) surface roughness of at least 30 nm and height variations of at least 200 nm, which would cause shorts using comparable prior methods. "Height variation" refers to the difference between the highest point and the lowest point on the surface of the rough material. The rough electrode preferably has a surface area at least 1.2 times greater than that of the underlying substrate.

The conformal layer is preferably polycrystalline, composed of a small molecule material, and is at least three monolayers thick. The lattice spacing of the organic semiconductor material will ordinarily be different from that of the electrode, creating strain in the conformal layer. The organic semiconductor material is deposited onto the electrode at least until a lattice structure of the material relaxes, forming a plurality of domains. The minimum thickness in order to achieve continuous conformal polycrystalline coverage is typically around 10 nm. The thickness of the conformal layer is preferably less than 30 nm, and more preferably, less than 20 nm.

To maximize the fill factor (ff), the height variation of the rough electrode should be at least three times larger than the thickness of the conformal layer plus a minimum thickness of the layer of the organic semiconductor material having the opposite material type deposited thereon. More preferably, the height variation should be at least five times larger. Series resistance is proportional to fill factor. Using such parameters, fill factors exceeding 0.5 have been achieved, whereas polymer-based designs usually yield results below 0.3.

By creating a true conformal layer (i.e., a layer having substantially constant thickness), the surface area of the donor-acceptor heterojunction is increased by carrying the surface roughness through as a feature of the first organic semiconductor layer. Series resistance is lowered because the conformal layer can reliably be made very thin and because the smoothing layer (e.g., layer 122) can be omitted. Retaining the jagged features of the electrode promotes diffusivity of incident light, and the jagged donor-acceptor interface increases the surface area of the rectifying junction for exciton-disassociation.

The conformal layer is grown by cooling the substrate to a moderate to cool temperature (e.g., 10° to 30° C.), with an ambient pressure between 0.35 and 0.65 Torr. In comparison, the chamber walls, carrier gas, and organic molecules are heated to 350° C. to 500° C. The substrate temperature is sufficiently high that the incident organic molecules diffuse for short distances along the surface of the rough electrode, but below the energy required for formation of monocrystals. The effect is rapid nucleation on the electrode surface, with the formation of numerous small polycrystalline domains.

Figure 12A:
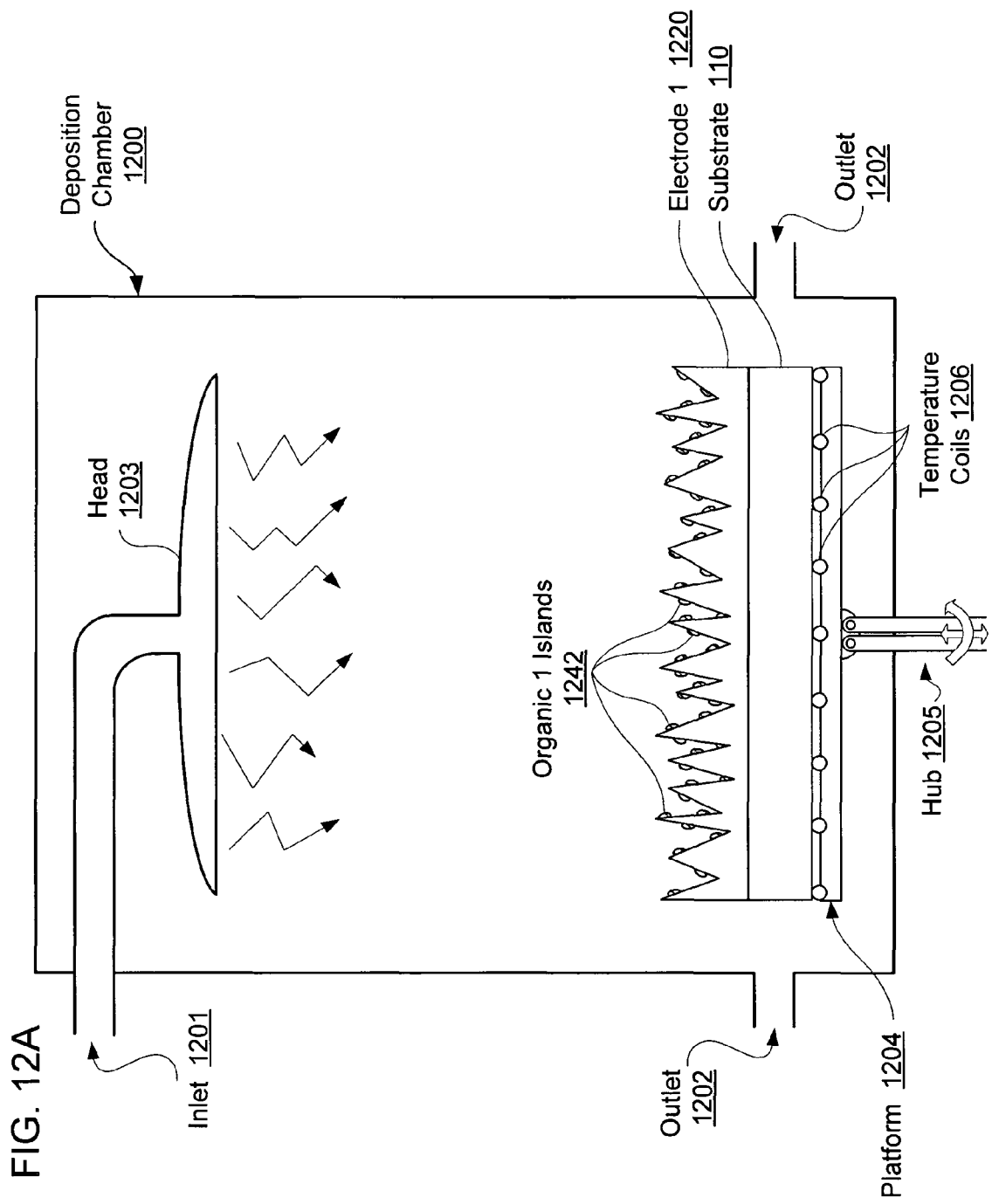
FIGS. 12A and 12B illustrate growth of a conformal layer of a first organic semiconductor material on a rough electrode by OVPD.
Figure 12B:
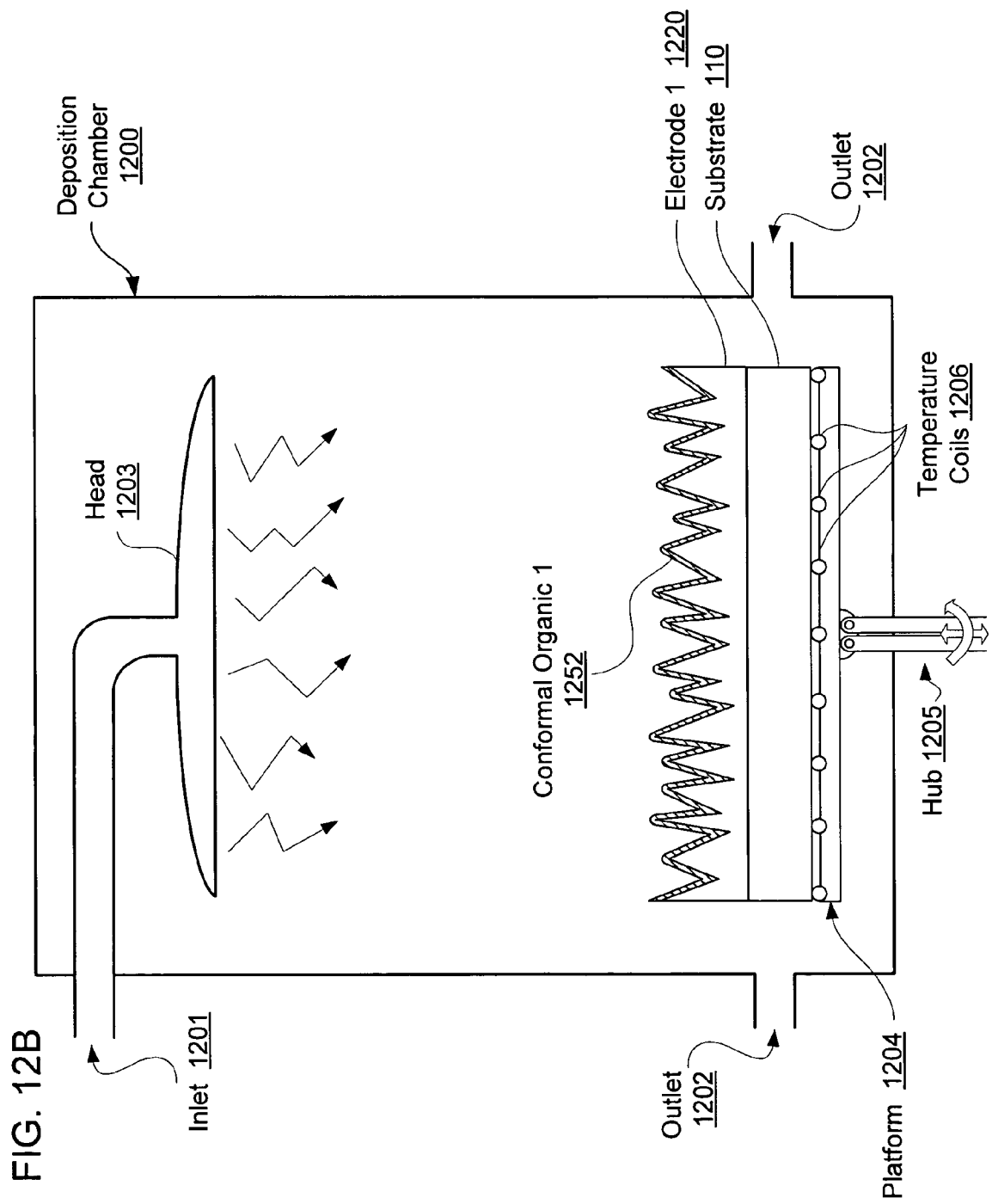

The growth process is illustrate in FIGS. 12A and 12B. The deposition chamber 1200 includes an inlet 1201 connected to a gas-delivery head 1203, and outlets 1202. The platform 1204 on which the substrate 110 is mounted includes temperature coils 1206 through which fluid is passed to heat or cool the substrate 110. The platform 1004 is mounted on a hub 1205 that allows the platform to be raised, lowered, rotated, and/or tilted. Although not illustrated, the walls of the deposition chamber 1200 are heated, and other apparatus may be included to control the temperature of the substrate (e.g., piezo-electric cooling elements; infrared heaters).

As illustrated in FIG. 12A, molecules of a first organic semiconductor material are delivered at random vectors to nucleate on the rough electrode 1220, forming numerous islands 1242 on the surface of the electrode 1220. As the result of further nucleation and island expansion, a continuous conformal layer 1252 is produced, as shown in FIG. 12B.

Once the conformal layer is formed, the device construction can be completed by forming any number of structures. For example, as illustrate in FIG. 12C, a layer of a second organic semiconductor material 1254 can be deposited directly on the conformal layer 1252, forming a donor-acceptor heterojunction. Although the second organic semiconductor layer 1252 is illustrated as planar, any structure can be used (including conformal), so long as there is no non-rectifying path for charge carriers from the first organic semiconductor material 1252 to the later-formed second electrode, charge transfer layer, or recombination layer. Further, if not conformal, other deposition method besides OVPD may be used to form the second organic semiconductor layer 1254.

Figure 13:
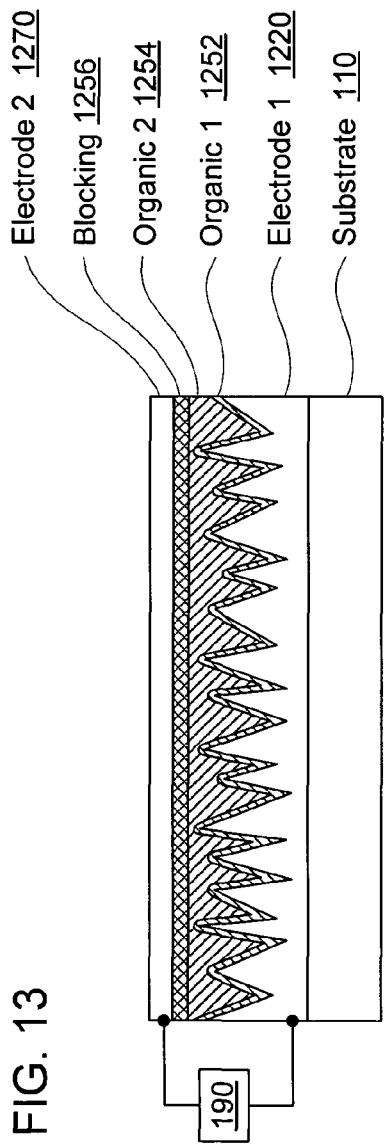
FIG. 13 illustrates an example of a finished device made with the process described with FIGS. 12A-12D.

The device is then finished off with an exciton blocking layer 1256 and a top electrode 1270, as illustrated in FIG. 13.

For a single cell design, the first electrode 1270 will be the anode, the first organic semiconductor layer 1252 will be the donor, the second organic semiconductor layer 1254 will be the acceptor, and the second electrode 1270 will be the cathode. Reverse arrangements can also be used. In reverse designs (cathode on the bottom), both the exciton blocking layer and the acceptor may be formed as conformal layers.

In addition to donor-acceptor heterojunction devices, the conformal organic semiconductor layer may be used to form a Schottky device with a rough electrode, as generally described above with FIG. 6.

The cell may be arranged in a tandem device, as shown in FIGS. 7 and 8. If arranged as a tandem device, a rough electrode material may be deposited as an intermediate electrode or charge transfer layer. As low temperature chemical vapor deposition of rough electrode materials generally increases roughness, such processes are well suited maximizing roughness without decomposition of the underlying organic materials.

Figure 15:
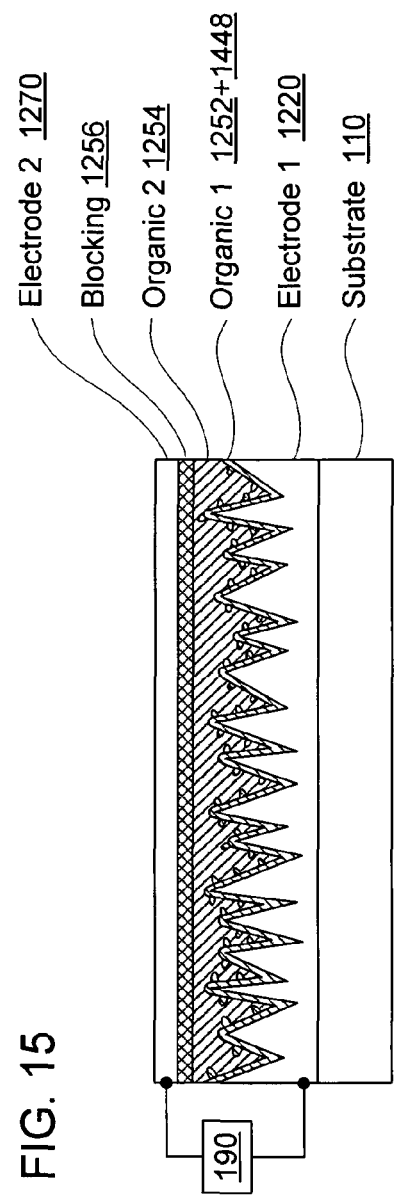
FIG. 15 illustrates an example of a finished device including the protrusions from FIG. 14.
Figure 14:
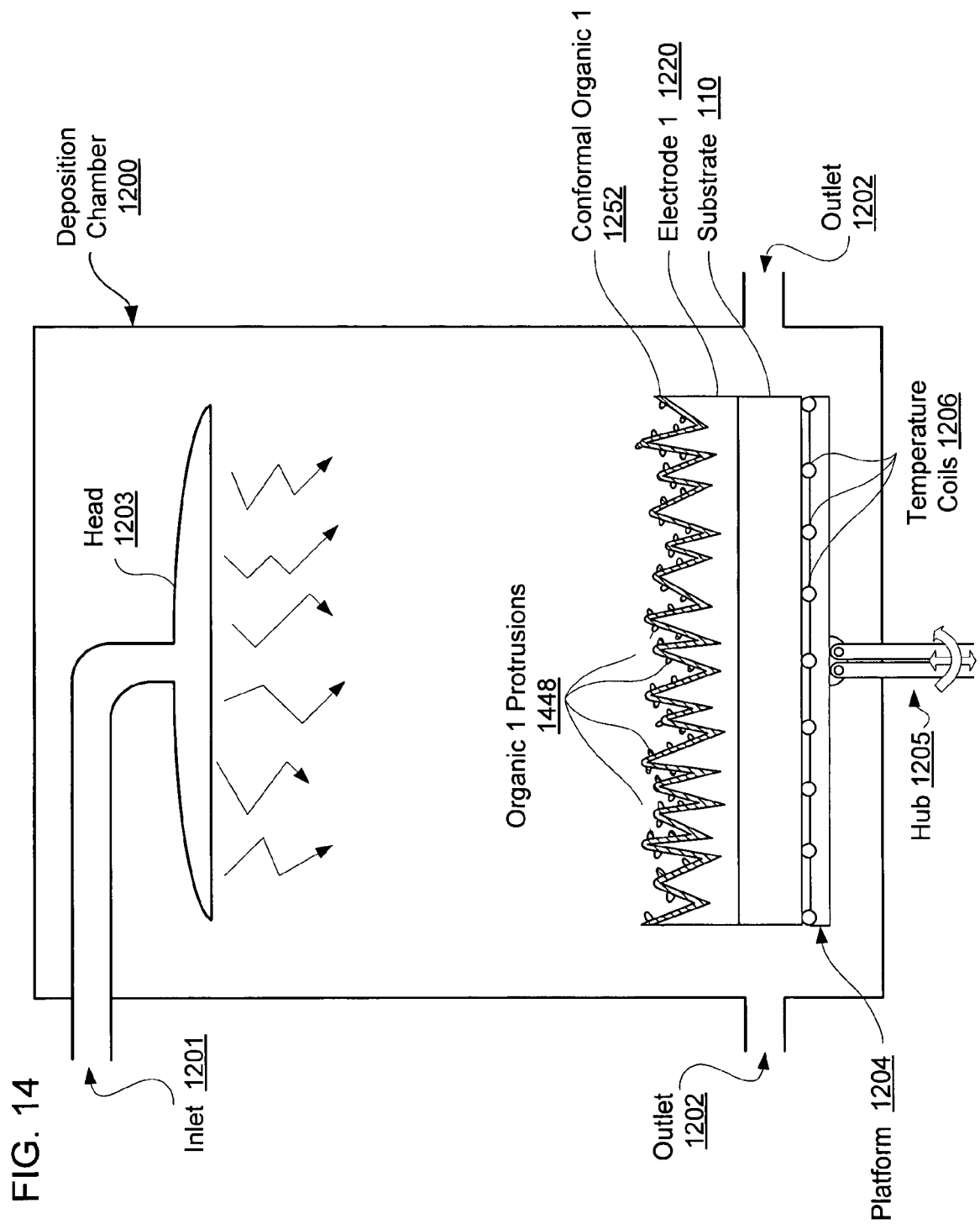
FIG. 14 illustrates growth of protrusions of the first organic semiconductor material on the conformal layer from FIG. 12B, prior to deposition of the second organic semiconductor material as illustrated in FIG. 12C.

To further increase the surface area of the donor-acceptor heterojunction, protrusions 1448 of the first organic semiconductor material can be directly formed on the conformal layer 1252. FIG. 14 illustrates deposition of the protrusions 1448, and FIG. 15 illustrates a finished single cell device including the protrusions 1448. The height of each protrusion is greater than a cross-sectional width of the respective protrusion, producing a bulk-heterojunction structure. Two methods are available to create such protrusions.

A first method for forming the protrusions 1448 can be grown is the Stranski-Krastanov layer-plus-island growth, as described (among other places) in "Ultrathin Organic Films Grown by Organic Molecular Beam Deposition and Related Techniques" by Forrest, Chemical Reviews Vol. 97, No. 6, 1793-1896 (1997); and F. Yang, M. Shtein, S. R. Forrest, *Nature Materials* 4, 37 (2005), which are incorporated herein by reference. After the conformal strained polycrystalline layer is grown to a thickness where coverage is continuous and the molecules begin to relax (for most material combinations, this thickness is between 10 and 20 nm), the substrate temperature is raised and the chamber pressure is lowered (relative to conditions used for conformal growth). This increases surface diffusivity, resulting in molecules skimming along the surface of the conformal layer 1252 until a point of energy equilibrium is reached (usually toward a middle of one of the polycrystalline domains where the conformal layer is most relaxed). The surface energy conditions favor further molecules bonding to these equilibrium-point nucleation sites, rather than the conformal layer 1252 itself, generating protrusions 1448.

The higher the strain in the wetting layer, the narrower the protrusions 1448 are for any given material. The resulting protrusions 1448 have very good crystallinity, which is favorable to high carrier mobility and low series resistance. Protrusions can be grown to heights as long as a micron, whereas protrusion cross-sections are on the order of the exciton diffusion length of the material—around fifty nanometers.

Another example of a controlled growth process by which protrusions 1448 can be grown is nucleation-by-condensation. The chamber pressure is increased to cause the molecules to cluster while still in the gas stream. The surface temperature of the substrate is lowered to decrease surface diffusivity, such that the clusters stick where they land. The result is protrusions having heights up to around one hundred nanometers, with cross-sections between ten to one hundred nanometers. The height and width dimensions tend to be similar to be on order of the exciton diffusion length of the material; for example, the height and width of the protrusions formed with CuPc were around 30 to 40 nm.

The nucleation-by-condensation growth process is easier to control than the Stranski-Krastanov method, but crystallinity in the protrusions 1448 is reduced (mobility for a same material is approximately 1/10 that achieved with Stranski-Krastanov). Mushroom-shaped protrusions that maximize surface area are easily formed with this method, since by morphology control, incoming clusters can be made to clump to the first surface they contact.

As is generally understood in the art, for any desired morphology, there is a balance between substrate temperature and pressure. For example, a small decrease in temperature can be compensated for with a small increase in pressure to achieve substantially the same morphology.

With regard to morphology control, if the substrate temperature is kept fixed, increasing pressure produces clusters (rough-growth nucleation-by-condensation), whereas decreasing the pressure produces conformal growth. Similarly, if pressure is fixed, a lower temperature produces low surface diffusivity and rough-growth cluster, a high temperature (below the crystallization energy of the material) produces conformal or planar growth, and a very high temperature (i.e., above the crystallization energy of the material) favors equilibrium growth columnar growth (i.e., Stranski-Krastanov). The crystallization energy of a material can be characterized by the temperature at which it will arrange itself into a monocrystalline structure as it is deposited.

From any point within the first organic semiconductor material deposited as the conformal layer and the protrusions, a distance to an interface boundary with a layer of an opposite material type is preferably no more than 2.5 exciton diffusion lengths of the first organic semiconductor material.

For growth of conformal layers, the material is preferably a small molecule material able to arrange itself into polycrystals. If the first organic semiconductor material is a donor, preferred small molecule materials are a phthalocyanine (e.g., copper phthalocyanine ("CuPc"), tin phthalocyanine ("SnPc") and zinc phthalocyanine ("ZnPc")), a phthalocyanine derivative (e.g., chloro[subphalocyaninato]boron(III) ("SubPc")), and 3,4,9,10-perylene tetracarboxylic dianhydride ("PTCDA").

If the first organic semiconductor material is an acceptor, preferred small molecule materials are a polyhedral fullerene having at least 60 carbon atoms (e.g., $C_o$, $C_{70}$) and 3,4,9,10-perylenetetracarboxylic bis-benzimidazole ("PTCBI").

All of these materials are known in the art, with the possible exception of SubPc, which is:

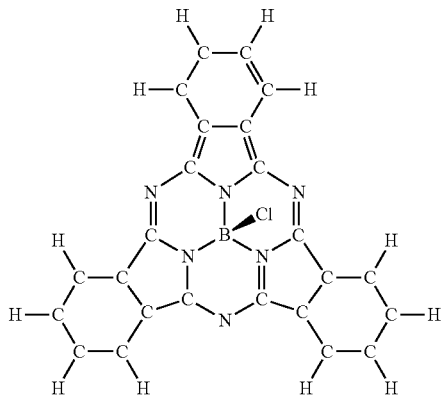

A further description of SubPc and related compounds can be found in U.S. patent application Ser. No. 11/442,062 by Kristin Mutolo et al., filed May 25, 2006 and entitled "Organic Photosensitive Devices Using Subphthalocyanine Compounds."

Each of these donor and acceptor materials has good light absorption and carrier absorption properties, and can be grown to form a polycrystalline structure. When the first layer 1252 is a donor, the second layer 1254 is preferably one of the above acceptors; when the first layer 1252 is an acceptor, the second layer 1254 is preferably one of the above donors. However, if the second layer 1254 is not conformal, the material can be any organic, including a polymer.

EXAMPLES

Small-molecular-weight organic layers used in the photovoltaic cells were deposited by OVPD on commercially SnO$_2$:F (*Asahi Glass Fabritech Co., Ltd.* 3-25-12, Tarumi-cho, Suita-city, Osaka, Japan, 564-0062) and ITO coated (*Applied Film Corp.,* 6797—*Winchester Circle,* Boulder, Colo. 80301) 1.1 mm thick glass substrates. The SnO$_2$:F layer was 750 nm thick, and the ITO layer was 150 nm thick. The solvent-cleaned substrates were exposed to ultra-violet+$O_3$ treatment for 5 min immediately prior to loading into the OVPD chamber.

Prior to CuPc and $C_{60}$ deposition by OVPD, the organic materials were purified in three cycles using vacuum thermal gradient sublimation. The OVPD growth chamber (base pressure <90 mTorr) maintains a continuous high purity nitrogen flow through the organic sources (see F. Yang, M. Shtein, S. R. Forrest, *Journal of Applied Physics* 98, 014906 (2005); M. Shtein, H. F. Gossenberger, J. B. Benziger, S. R. Forrest, *Journal of Applied Physics* 89, 1470 (2001)). The substrate temperature was controlled by flowing water through a copper holder. The $N_2$ carrier gas flow rate was regulated with mass flow meters (MKS Instruments) and the chamber pressure is independently controlled with a butterfly valve (MKS Instruments).

The conditions for the growth of the planar CuPc were: $T_{source}$=446±1° C., $T_{substrate}$=16±1° C., $N_2$ flow rate=150 sccm, chamber pressure=0.587±0.001 Torr, and the deposition time was 140 seconds. The growth conditions for rough CuPc films were: $T_{source}$=446±1° C., $T_{substrate}$=6±1° C., $N_2$ flow rate=100 sccm, chamber pressure=1.000±0.001 Torr, and the deposition time was 140 seconds. The growth conditions for $C_{60}$ were: $T_{source}$=472±2° C., $T_{substrate}$=16±1° C., $N_2$ flow rate=100 sccm, chamber pressure=0.460±0.001 Torr, and the deposition time was 830 seconds. After CuPc/$C_{60}$ growth, the samples were transferred through a nitrogen glove box into a vacuum chamber with pressure <$2 \times 10^{-7}$ Torr, where a 100 Å thick BCP layer, and the 1000 Å thick Ag cathode were deposited through a shadow mask with an array of 1 mm diameter circular openings via thermal evaporation.

The surface morphologies of $SnO_2$:F and ITO coated glass substrates were studied with an X30 field-emission scanning electron microscope (Philips) and a Dimension 3000 atomic force microscope (Veeco) in tapping mode. A variable angle, spectroscopic ellipsometer (WASE series, J. A. Woollam) was used to measure the thickness of films on an Si wafer to determine growth rate. Solar cell performance was tested in ambient conditions in air. Unless otherwise noted, the J-V characteristics and power conversion efficiencies of the devices were measured under simulated AM 1.5G solar illumination at 1 sun intensity using an HP4155B semiconductor parameter analyzer. The illumination intensity was varied using neutral density filters and measured using a calibrated broadband optical power meter. Photocurrent spectra were recorded using a monochromatic beam of light from a tungsten-halogen lamp and chopped at 400 Hz. The monochromatic light was calibrated using a Si photodetector, and photocurrent was measured using a lock-in amplifier referenced to the chopper frequency. Transmittance and absorption spectra were measured using a Perkin-Elmer Lambda 800 UV/Visible spectrometer.

By controlling the organic film morphology, the donor-acceptor (D-A) interface grew into a three-dimensional interdigitated bulk heterojunction structure, resulting in power conversion efficiencies nearly twice those of analogous devices with a planar heterointerface. By changing the OVPD growth conditions for CuPc and $C_{60}$, we are able to adjust the film surface morphology and crystallization to optimize interfacial surface area while achieving a continuous substrate coverage The resulting copper phthalocyanine (CuPc)/$C_{60}$ heterojunction photovoltaic cells on $SnO_2$:F anodes had a power conversion efficiency of 2.5% at 1 sun simulated AM 1.5 G illumination.

Figure 16:
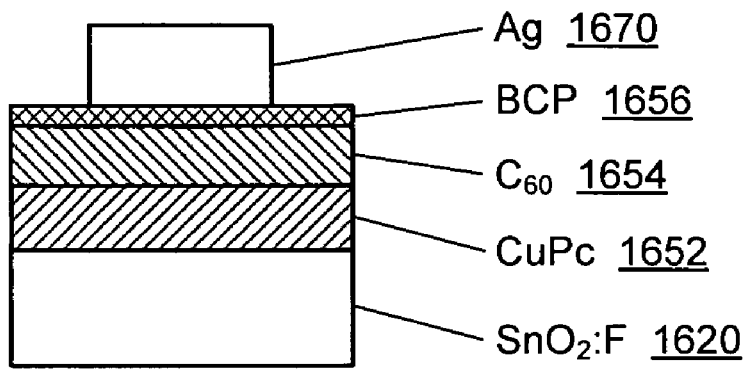
FIG. 16 is a schematic structure of a device having a planar CuPc followed by a planar $C_{60}$ layer grown on $SnO_2$:F-coated glass.
Figure 17:
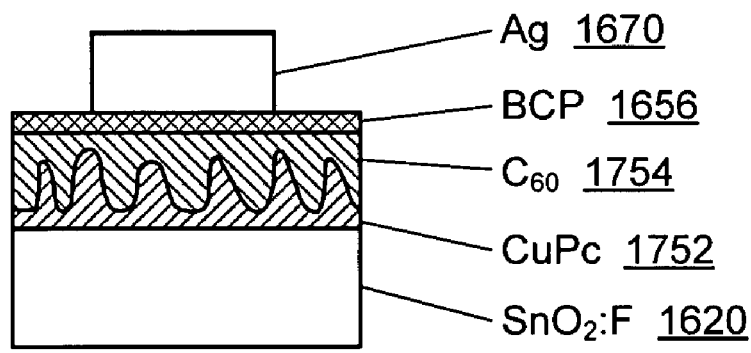
FIG. 17 is a schematic structure of a device having a continuous CuPc layer with nano-size protrusions covered by a planar $C_{60}$ layer grown on $SnO_2$:F-coated glass.
Figure 18:
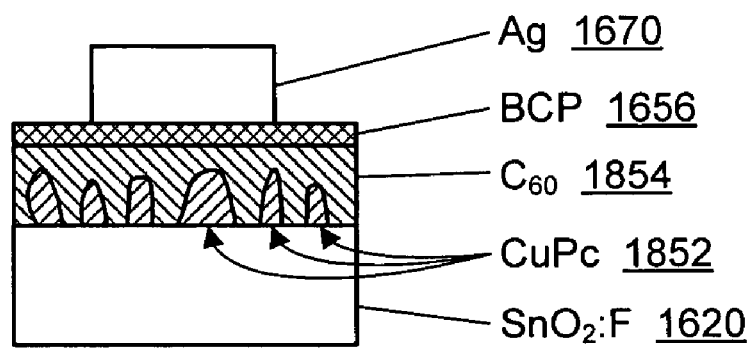
FIG. 18 is a schematic structure of a device having CuPc nano-size protrusions with no continuous CuPc layer, covered by a planarizing $C_{60}$ layer grown on $SnO_2$:F-coated glass. Unlike the structures in FIGS. 16 and 17, the structure in FIG. 18 includes conductive pathways through the $C_{60}$ layer between the $SnO_2$:F anode and Ag cathode.

Three photovoltaic cell structures with 490±5 Å thick $C_{60}$ acceptor layers were grown on the surface of CuPc donor films on $SnO_2$:F (1620). In the planar heterojunction shown in FIG. 16, both CuPc (1652) and $C_{60}$ (1654) form continuous layers, with CuPc thicknesses of 240 Å (d1). In the bulk heterojunction structure (d2, FIG. 17), we first grew a 120 Å-thick CuPc layer followed by a layer of CuPc with nanometer-scale protrusions (illustrated together as 1752), covering the protrusions with a continuous layer of $C_{60}$ (1754). The average thickness of this second growth is also 120 Å. Structure d3 (FIG. 18) consisted of CuPc protrusions (1852) without a continuous base layer, covered by a layer of continuous $C_{60}$ (1854).

Figure 19:
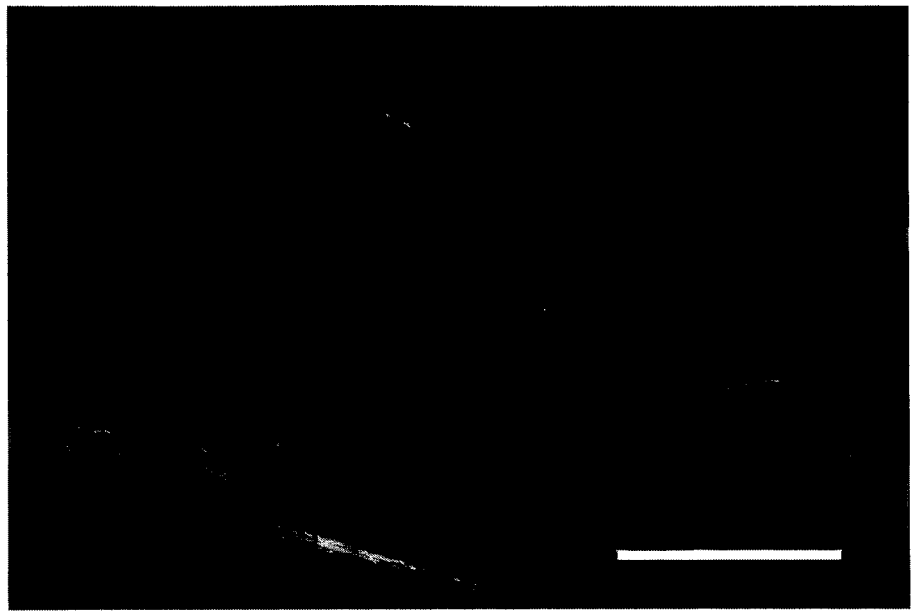
FIG. 19 is a scanning electron microscope image of the surface morphology of a 240 Å-thick continuous CuPc layer grown on $SnO_2$:F by organic vapor phase deposition (OVPD). The scale bar in the micrograph corresponds to a distance of 200 nm.
Figure 20:
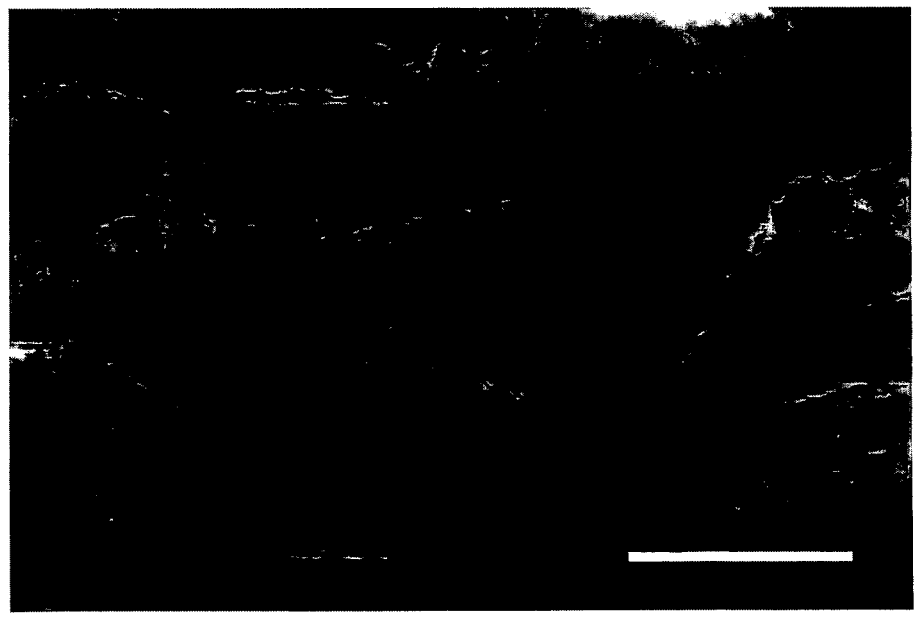
FIG. 20 illustrates a scanning electron microscope image of the surface morphology of a 120 Å-thick continuous CuPc layer followed by CuPc nano-size protrusions grown on $SnO_2$:F by organic vapor phase deposition (OVPD). The scale bar in the micrograph corresponds to a distance of 200 nm.
Figure 21:
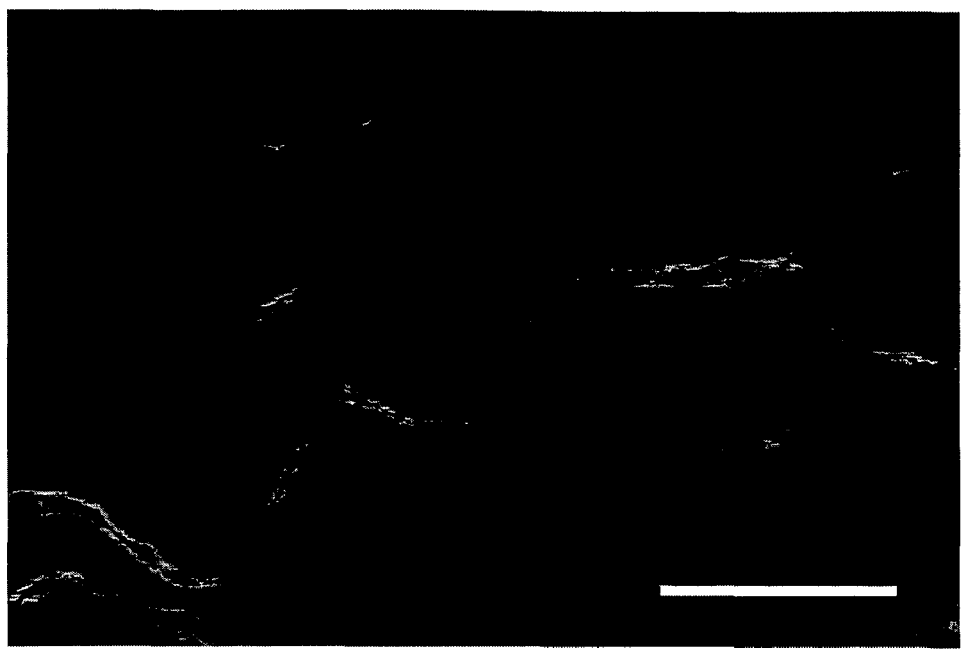
FIG. 21 illustrates a scanning electron microscope image of the surface morphology of a $C_{60}$ layer grown by organic vapor phase deposition (OVPD) on top of the CuPc from FIG. 20. The scale bar in the micrograph corresponds to a distance of 200 nm.

Scanning electron micrographs show a smooth surface consisting of a 240 Å-thick, continuous CuPc layer as used in structure d1 (FIG. 19), and a planar-plus-rough CuPc film used in structure d2 (FIG. 20) where the protrusions evenly distribute on the conformal layer that covers the $SnO_2$:F crystals. The CuPc protrusions are comparable to the exciton diffusion length, $L_D$, i.e. they are 20-30 nm in width and 40-50 nm high. After the CuPc growth, $C_{60}$ was deposited in the same OVPD chamber without exposure to atmosphere. As shown in FIG. 21, the $C_{60}$ forms a smooth and planar surface that completely covers the CuPc protrusions in FIG. 20. A BCP exciton blocking layer (1656) deposited over the $C_{60}$.

Figure 22:
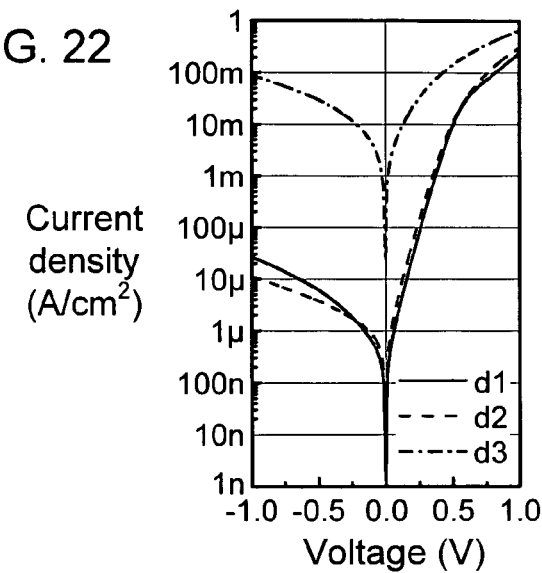
FIG. 22 illustrates current density versus voltage characteristics in the dark for CuPc/$C_{60}$ solar cells grown on $SnO_2$:F glass grown by OVPD with different CuPc layers: 240 Å-thick continuous CuPc (d1), 120 Å-thick continuous layer followed by a protrusive coating (d2), and protrusions without an initial continuous layer (d3).

All three CuPc/$C_{60}$ heterojunction devices show rectification in the dark (FIG. 22), and generate photocurrent under illumination (FIG. 23), forming solar cells with thin organic layers (<800 Å) on the rough $SnO_2$:F substrates. For the planar heterojunction structures d1, and the bulk heterojunction structure d2, the current rectification ratios at ±1.0 V in the dark are >$10^4$, implying a continuous p-n junction between the $SnO_2$:F anode and the Ag cathode (1670). In contrast, device d3 has a rectification ratio of 8, since gaps between the CuPc protrusions allows $C_{60}$ to directly contact the underlying $SnO_2$:F, resulting in local shorts (see FIG. 18).

Figure 23:
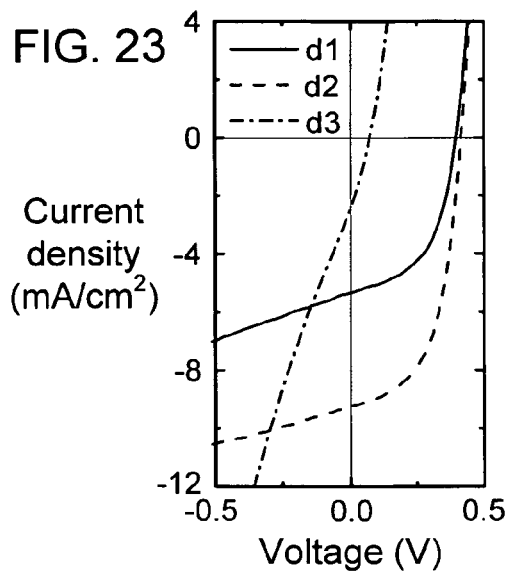
FIG. 23 illustrates current density versus voltage characteristics under 1 sun (100 mW/cm$^2$) AM1.5 illumination for the same solar cells described with FIG. 22.

The performances of the three devices under illumination are compared in FIG. 23. Device d3, with its small shunt resistance, has a small open circuit voltage ($V_{OC}$=0.08 V) and a low fill factor (ff) as expected. The short circuit current ($J_{SC}$) increases from 5.2 mA/$cm^2$ in device d1, to 9.1 mA/$cm^2$ in the bulk heterojunction device, d2. This indicates that the interdigitated CuPc/$C_{60}$ interface is effective in increasing the exciton dissociation efficiency at the donor-acceptor junction.

Figure 24:
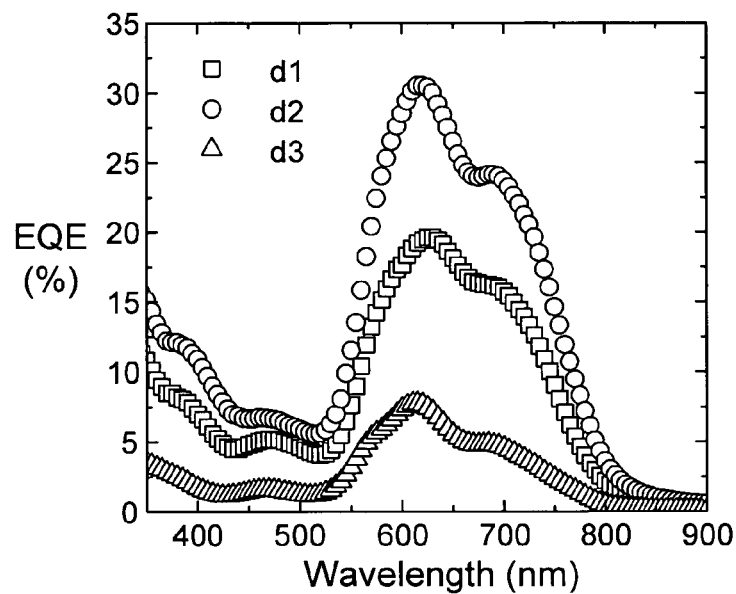
FIG. 24 illustrates external quantum efficiency (EQE) of CuPc/$C_{60}$ photovoltaic cells grown by OVPD with different heterojunction structures.
Figure 25:
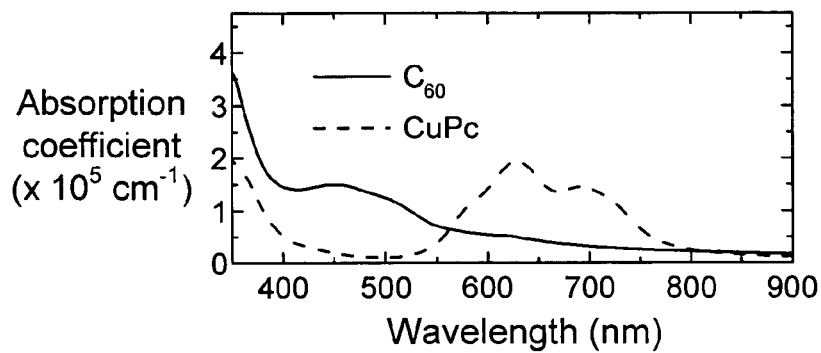
FIG. 25 illustrates the absorption coefficients of CuPc and $C_{60}$.

The external quantum efficiency (EQE) is measured as a function of wavelength in FIG. 24. The EQE peaks centered at λ=620 and 695 nm are due to absorption in CuPc, and the EQE peak at 470 nm is due to the absorption in $C_{60}$ (FIG. 25). In FIG. 24, the EQE of CuPc at λ=620 nm increases from 19% in the planar heterojunction, to 31% in the bulk heterojunction, while the peak at λ=470 nm only increases from 5% to 6%. This implies that the increase in donor-acceptor interface area characteristic of the bulk heterojunction is more efficient in dissociating excitons absorbed in CuPc, where the exciton diffusion length of $L_D$=10 nm is less than that in $C_{60}$ ($L_D$=40 nm; see P. Peumans, A. Yakimov, S. R. Forrest, *Journal of Applied Physics* 93, 3693 (2003)).

From the overlap integral of EQE(λ) with the AM 1.5 solar irradiation spectrum (*National Renewable Energy Laboratory, ASTM G-173-03, air mass* 1.5 *reference solar spectral irradiance.* Website: <http://rredc.nrel.gov/solar/spectra/am1.5/>), the $J_{SC}$ for the planar heterojunction device (d1) and the bulk heterojunction device (d2) was calculated to be 3.5 mA/$cm^2$ and 6.1 mA/$cm^2$, respectively, or approximately 30% lower than the values obtained by direct measurement. This is attributed to the device degradation and mismatch between the simulated and standard AM 1.5 solar spectra (see P. Peumans, S. R. Forrest, *Applied Physics Letters* 116, 1713 (2002); S. Yoo, B. Domercq, B. Kippelen, *Applied Physics Letters* 85, 5427 (2004)).

Figure 26:
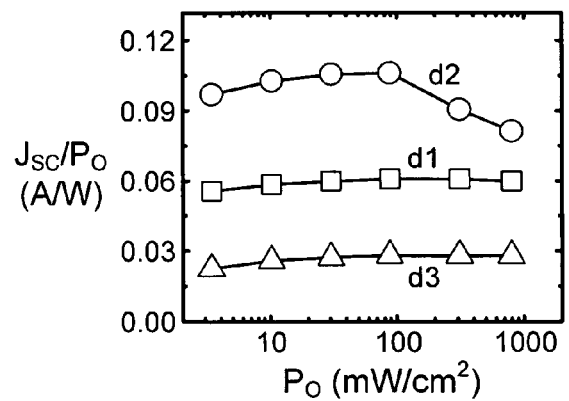
FIG. 26 through FIG. 29 illustrate the performance of CuPc/C$_{60}$ solar cells grown on SnO$_2$:F glass grown by OVPD under various light intensities for several heterojunction structures.
Figure 27:
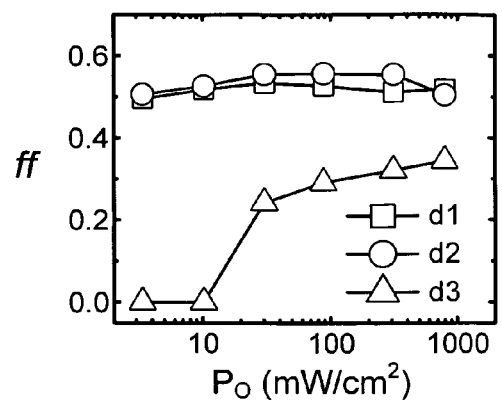
Figure 28:
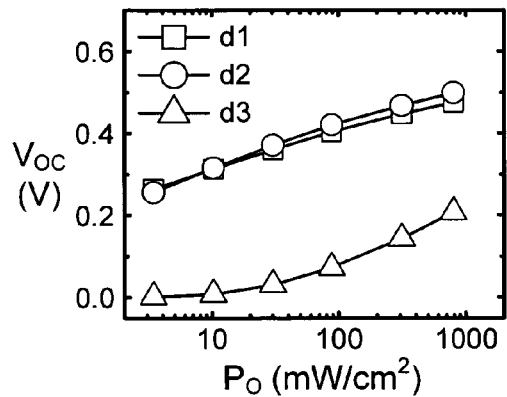

The performances of the four CuPc/$C_{60}$ heterojunction solar cells were further studied by measuring the devices under different illumination intensities. The responsivity ($J_{SC}/P_0$, where $P_0$ is the incident light power) is plotted in FIG. 26 as function of $P_0$. Device d2 has a responsivity of 0.11±0.01 A/W at 1 sun, a value close to twice of that of d1 (0.060±0.005 A/W), while the responsivity of d3 is 0.028±0.005 A/W. In FIG. 27, we find that ff>0.5 for the bulk heterojunction and planar heterojunction devices when illuminated under the range of 0.02 to 8 suns, and ff>0.55 at 1 sun, implying that the controlled growth of a bulk heterojunction does not introduce series resistance (see F. Yang, M. Shtein, S. R. Forrest, *Nature Materials* 4, 37 (2005)), an advantage over the random bulk heterojunction solar cells obtained by mixing polymers (see J. J. M. Halls, C. A. Walsh, N.C. Greenham, E. A. Marseglia, R. H. Friend, S. C. Moratti, A. B. Holmes, *Nature* 376, 498 (1995)) or annealing small molecule donor-acceptor mixtures (see P. Peumans, S. Uchida, S. R. Forrest, *Nature* 425, 158 (2003)). In addition, $V_{OC}$ is unchanged for devices d1 and d2 across the entire range of intensities shown in FIG. 28, despite their different morphologies. By comparison, $V_{OC}$ of device d3 is lower due to its small shunt resistance, as expected.

The interface area is similar between the bulk heterojunction structure d2 and the protrusion-without-continuous layer CuPc/$C_{60}$ structure (d3), but the increases in responsivity, ff and $V_{OC}$ in d2 show the importance of having a continuous CuPc layer covering the anode to eliminate current shunt paths. Note that $V_{OC}$ of the planar heterojunction devices grown on $SnO_2$:F is approximately 0.1 V less than that of a control planar heterojunction CuPc/$C_{60}$/BCP/Ag device grown on an ITO anode under similar illumination intensities (see P. Peumans, V. Bulovic, S. R. Forrest, *Applied Physics Letters* 76, 2650 (2000); S. Khodabakhsh, B. M. Sanderson, J. Nelson, T. S. Jones, *Advanced Functional Materials* 16, 95 (2006)). The difference of $V_{OC}$ is comparable to the work function ($\phi$) difference between $SnO_2$:F ($\phi$=4.9 eV) and ITO ($\phi$=4.8 eV) (see R. G. Gordon, *MRS Bulletin* 25, 52 (2000)), although a systematic study of the origin of $V_{OC}$ is beyond the scope of this work.

Figure 29:
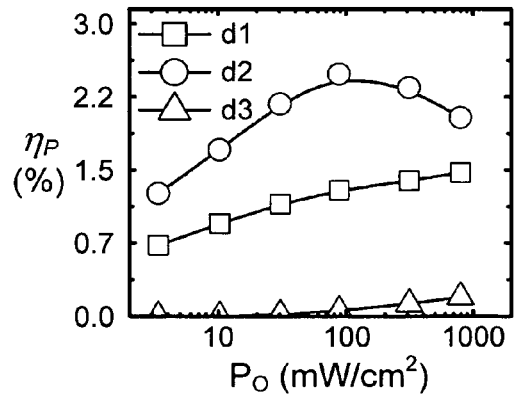

FIG. 29 shows the power conversion efficiencies of the various CuPc/$C_{60}$ junction devices studied. The bulk heterojunction device has the highest $\eta_P$, peaking at 2.5±0.2% at 1 sun illumination, which is twice of that of planar heterojunction device ($\eta_P$=1.3±% for d1), and ten times of that of d3, where $\eta_P$=0.6±0.1% at 1 sun. Compared to the previously published planar heterojunction structure ITO/CuPc(200 Å)/$C_{60}$(400 Å)/BCP (100 Å)/Ag (1000 Å) where $\eta_P$=3.6±0.2% (see J. Xue, S. Uchida, B. P. Rand, S. Forrest, *Applied Physics Letters* 84, 3013 (2004)) and $\eta_P$=3.2±0.2% (see F. Yang, M. Shtein, S. R. Forrest, *Journal of Applied Physics* 98, 014906 (2005)) grown by VTE and OVPD, respectively, $\eta_P$ of the cells grown on $SnO_2$:F in this work is lower, possibly due to the higher resistance of the 750 nm thick oxide, and the non-optimized organic layer thicknesses.

In conclusion, we have grown efficient small molecule organic solar cells on indium-free $SnO_2$:F-coated glass substrates using OVPD, and have studied the influence of nanoscale heterojunction morphology on the solar cell performance. The conformal nature of OVPD growth resulted in continuous layers of CuPc and $C_{60}$ on the rough $SnO_2$:F surface, resulting in high efficiency devices. OVPD growth was used to generate either a planar interface, or one with nanoscale features on the order of an exciton diffusion length in CuPc. The bulk heterojunction solar cell formed by a continuous layer plus protrusions CuPc and a covering $C_{60}$ layer has a power efficiency of 2.5±0.2% at 1 sun simulated AM 1.5 G illumination, close to twice of that of similar planar heterojunction devices. Our results show that OVPD can be used to grow efficient organic solar cells on low-cost rough-electrode coated substrates. The methodology employed would work for any number of other rough electrode materials, including (but not limited to) doped ZnO, and carbon nanotubes in a small-molecule or polymer matrix.

Although OVPD is the preferred method for forming the conformal layer as it reliably produces superior results (short-free with faster deposition times and lower costs), other methods may be adapted to form the conformal layer, such as vacuum thermal evaporation (VTE), organic molecular beam deposition (OMBD) and organic vapor jet deposition (OVJD). With VTE, a conformal layer can be formed by cooling the substrate during the deposition (as with OVPD), and repeatedly changing the angle of the substrate relative to the source during the deposition. With OMBD, the substrate is increased to promote surface diffusion and the angle on the substrate is repeatedly changed during deposition. With OVJD, the substrate is cooled as with OVPD, and the angle of the substrate and/or the jet nozzle(s) are repeatedly changed during deposition.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell). The materials, structures and fabrications approaches described herein may have applications in devices other than organic photovoltaic cells. For example, other optoelectronic devices such as organic photodetectors, organic photosensors, and organic light-emitting diodes may employ the materials, structures and fabrication approaches. More generally, organic devices, such as organic transistors, may employ the materials, structures and fabrication approaches.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A method of fabricating an optoelectronic device, comprising:
    providing a first electrode disposed on a substrate, an exposed surface of the first electrode having a root mean square roughness of at least 30 nm and a height variation of at least 200 nm, the first electrode being transparent;
    depositing a conformal layer of a first organic semiconductor material onto said first electrode, the first organic semiconductor material being a small molecule material;
    depositing nanometer scale protrusions of the first organic semiconductor material directly onto said conformal layer;
    depositing a layer of a second organic semiconductor material over the conformal layer, at least some of the layer of the second organic semiconductor material directly contacting the conformal layer; and
    depositing a second electrode over the layer of the second organic semiconductor material, wherein the first organic semiconductor material is of a donor-type or an acceptor-type relative to the second organic semiconductor material, which is of the other material type.

2. The method of claim 1, wherein the conformal layer is deposited by organic vapor phase deposition.

3. The method of claim 1, the first electrode consists essentially of a material selected from a doped or undoped transparent conducting oxide, and carbon nanotubes in a small molecule or polymer matrix.

4. The method of claim 1, wherein the first electrode has a surface area at least 1.2 times greater than a surface area of the substrate.

5. The method of claim 1, wherein the conformal layer has a thickness of less than 300 Å.

6. The method of claim 5, wherein the thickness of the conformal layer is less than 200 Å.

7. The method of claim 1, wherein the layer of the second organic material is a continuous layer.

8. The method of claim 7, wherein the height variation of the first electrode is at least three times larger than a thickness of the conformal layer plus a minimum thickness of the layer of the second organic semiconductor material.

9. The method of claim 8, wherein the height variation of the first electrode is at least five times larger than the thickness of the conformal layer plus the minimum thickness of the layer of the second organic semiconductor material.

10. The method of claim 1, wherein the conformal layer of the first organic semiconductor material is deposited directly onto the first electrode.

11. The method of claim 10, wherein a strain is created in the conformal layer at an interface with the first electrode, and wherein depositing the conformal layer includes depositing the first organic semiconductor material onto said first electrode until a lattice structure of the first organic semiconductor material relaxes, forming a plurality of domains of the first organic semiconductor material, the conformal layer being polycrystalline.

12. The method of claim 1, wherein the first organic semiconductor material is a donor-type material relative to the second organic semiconductor material, which is an acceptor-type material.

13. The method of claim 12, wherein the donor-type material is selected from a phthalocyanine, a phthalocyanine derivative, and 3,4,9,10-perylene tetracarboxylic dianhydride (PTCDA).

14. The method of claim 13, wherein the phthalocyanine is selected from copper phthalocyanine (CuPc), tin phthalocyanine (SnPc) and zinc phthalocyanine (ZnPc), and the phthalocyanine derivative is selected from chloro[subphalocyaninato]boron(III) (SubPc).

15. The method of claim 1, wherein the first organic semiconductor material is an acceptor-type material relative to the second organic semiconductor materials, which is a donor-type material.

16. The method of claim 15, wherein the acceptor-type material is selected from a polyhedral fullerene having at least 60 carbon atoms and 3,4,9,10-perylenetetracarboxylic bis-benzimidazole (PTCBI).

17. The method of claim 1, wherein the combination of the conformal layer with the protrusions has a surface area at least two times greater than a surface area of the conformal layer without the protrusions, wherein the layer of the second organic semiconductor material is deposited after the depositing of the protrusions.

18. The method of claim 17, wherein the height of each protrusion is greater than a cross-sectional width of the respective protrusion.

19. The method of claim 17, wherein from any point within the first organic semiconductor material deposited as the conformal layer and the protrusions, a distance to an interface boundary with a layer of an opposite material type is no more than 2.5 exciton diffusion lengths of the first organic semiconductor material.

20. A device comprising:
a substrate having a first electrode thereon, a surface of the first electrode opposite the substrate having a root mean square roughness of at least 30 nm and a height variation of at least 200 nm;
at least one donor-acceptor heterojunction composed of:
a conformal layer of a first organic semiconductor material on said surface of the first electrode, the first organic semiconductor material being a small molecule material;
a layer of a second organic semiconductor material on the conformal layer of the first organic semiconductor material, at least some of the second organic semiconductor material directly contacting the conformal layer, wherein the first organic semiconductor material is of a donor-type or an acceptor-type relative to the second organic semiconductor material, which is of the other material type;
nanometer scale protrusions of the first organic semiconductor material, in direct contact with the conformal layer and being between the conformal layer of the first organic semiconductor material and the layer of a second organic semiconductor material; and
a second electrode on the donor-acceptor heterojunction.

21. The device of claim 20, wherein the first electrode consisting essentially of a material selected from a doped or undoped transparent conducting oxide, and carbon nanotubes in a small molecule or polymer matrix.

22. The device of claim 20, wherein the first electrode has a surface area at least 1.2 times greater than a surface area of the underlying substrate.

23. The device of claim 20 wherein the conformal layer has a thickness of less than 300 Å.

24. The device of claim 23, wherein the thickness of the conformal layer is less than 200 Å.

25. The device of claim 20, wherein the layer of the second organic material is a continuous layer.

26. The device of claim 25, wherein the height variation of the first electrode is at least three times larger than the thickness of the conformal layer plus a minimum thickness of the layer of the second organic semiconductor material.

27. The device of claim 26, wherein the height variation of the first electrode is at least five times larger than the thickness of the conformal layer plus the minimum thickness of the layer of the second organic semiconductor material.

28. The device of claim 20, wherein the conformal layer is polycrystalline.

29. The device of claim 28, wherein the donor-type material is selected from a phthalocyanine, a phthalocyanine derivative, and 3,4,9,10-perylene tetracarboxylic dianhydride (PTCDA).

30. The device of claim 29, wherein the phthalocyanine is selected from copper phthalocyanine (CuPc), tin phthalocyanine (SnPc) and zinc phthalocyanine (ZnPc), and the phthalocyanine derivative is selected from chloro[subphalocyaninato]boron(III) (SubPc).

31. The device of claim 28, wherein the acceptor-type material is selected from a polyhedral fullerene having at least 60 carbon atoms and 3,4,9,10-perylenetetracarboxylic bis-benzimidazole (PTCBI).

32. The device of claim 20, wherein the combination of the conformal layer with the protrusions has a surface area at least two times greater than a surface area of the conformal layer without the protrusions.

33. The device of claim 32, wherein the height of each protrusion is greater than a cross-sectional width of the respective protrusion.

34. The device of claim 33, wherein from any point within the conformal layer and the protrusions, a distance to an interface boundary with a layer of an opposite material type is no more than 2.5 exciton diffusion lengths of the first organic semiconductor material.

* * * * *